(12) United States Patent
Baker, Jr. et al.

(10) Patent No.: US 9,129,996 B2
(45) Date of Patent: Sep. 8, 2015

(54) NON-VOLATILE MEMORY (NVM) CELL AND HIGH-K AND METAL GATE TRANSISTOR INTEGRATION

(71) Applicants: Frank K. Baker, Jr., Austin, TX (US); Cheong Min Hong, Austin, TX (US)

(72) Inventors: Frank K. Baker, Jr., Austin, TX (US); Cheong Min Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 25 days.

(21) Appl. No.: 14/023,440

(22) Filed: Sep. 10, 2013

(65) Prior Publication Data

US 2015/0072489 A1   Mar. 12, 2015

(51) Int. Cl.
*H01L 29/66* (2006.01)
*H01L 21/28* (2006.01)
*H01L 27/115* (2006.01)

(52) U.S. Cl.
CPC .... *H01L 29/66833* (2013.01); *H01L 21/28273* (2013.01); *H01L 27/11546* (2013.01); *H01L 29/66825* (2013.01)

(58) Field of Classification Search
CPC .............. H01L 29/66825; H01L 21/28273; H01L 27/11546
See application file for complete search history.

(56) References Cited

U.S. PATENT DOCUMENTS

| 4,766,088 | A | * | 8/1988 | Kono et al. | 438/258 |
|---|---|---|---|---|---|
| 5,175,120 | A | * | 12/1992 | Lee | 438/201 |
| 5,183,773 | A | * | 2/1993 | Miyata | 438/201 |
| 5,223,451 | A | * | 6/1993 | Uemura et al. | 438/201 |
| 5,304,503 | A | * | 4/1994 | Yoon et al. | 438/258 |
| 5,614,746 | A | | 3/1997 | Hong et al. | |
| 6,087,225 | A | | 7/2000 | Bronner et al. | |
| 6,194,301 | B1 | | 2/2001 | Radens et al. | |
| 6,235,574 | B1 | | 5/2001 | Tobben et al. | |
| 6,333,223 | B1 | | 12/2001 | Moriwaki et al. | |
| 6,388,294 | B1 | | 5/2002 | Radens et al. | |
| 6,509,225 | B2 | | 1/2003 | Moriwaki et al. | |
| 6,531,734 | B1 | | 3/2003 | Wu | |
| 6,635,526 | B1 | | 10/2003 | Malik et al. | |
| 6,707,079 | B2 | | 3/2004 | Satoh et al. | |
| 6,777,761 | B2 | | 8/2004 | Clevenger et al. | |
| 6,785,165 | B2 | | 8/2004 | Kawahara et al. | |
| 6,939,767 | B2 | | 9/2005 | Hoefler et al. | |
| 7,154,779 | B2 | | 12/2006 | Mokhlesi et al. | |
| 7,183,159 | B2 | | 2/2007 | Rao et al. | |

(Continued)

FOREIGN PATENT DOCUMENTS

WO   2009058486   5/2009

OTHER PUBLICATIONS

Office Action mailed Nov. 22, 2013 in U.S. Appl. No. 13/780,591.

(Continued)

*Primary Examiner* — Richard Booth

(57) ABSTRACT

A method of making a semiconductor device includes depositing a layer of polysilicon in a non-volatile memory (NVM) region and a logic region of a substrate. The layer of polysilicon is patterned into a gate in the NVM region while the layer of polysilicon remains in the logic region. A memory cell is formed including the gate in the NVM region while the layer of polysilicon remains in the logic region. The layer of polysilicon in the logic region is removed and the substrate is implanted to form a well region in the logic region after the memory cell is formed. A layer of gate material is deposited in the logic region. The layer of gate material is patterned into a logic gate in the logic region.

20 Claims, 21 Drawing Sheets

(56) References Cited

U.S. PATENT DOCUMENTS

| | | |
|---|---|---|
| 7,190,022 B2 | 3/2007 | Shum et al. |
| 7,202,524 B2 | 4/2007 | Kim et al. |
| 7,208,793 B2 | 4/2007 | Bhattacharyya |
| 7,256,125 B2 | 8/2007 | Yamada et al. |
| 7,271,050 B2 | 9/2007 | Hill |
| 7,365,389 B1 | 4/2008 | Jeon et al. |
| 7,391,075 B2 | 6/2008 | Jeon et al. |
| 7,402,493 B2 | 7/2008 | Oh et al. |
| 7,405,968 B2 | 7/2008 | Mokhlesi et al. |
| 7,439,134 B1 | 10/2008 | Prinz et al. |
| 7,476,582 B2 | 1/2009 | Nakagawa et al. |
| 7,521,314 B2 | 4/2009 | Jawarani et al. |
| 7,524,719 B2 | 4/2009 | Steimle et al. |
| 7,544,490 B2 | 6/2009 | Ferrari et al. |
| 7,544,980 B2 | 6/2009 | Chindalore et al. |
| 7,544,990 B2 | 6/2009 | Bhattacharyya |
| 7,560,767 B2 | 7/2009 | Yasuda et al. |
| 7,795,091 B2 | 9/2010 | Winstead et al. |
| 7,799,650 B2 | 9/2010 | Bo et al. |
| 7,816,727 B2 | 10/2010 | Lai et al. |
| 7,821,055 B2 | 10/2010 | Loiko et al. |
| 7,906,396 B1 | 3/2011 | Chiang et al. |
| 7,932,146 B2 | 4/2011 | Chen et al. |
| 7,989,871 B2 | 8/2011 | Yasuda |
| 7,999,304 B2 | 8/2011 | Ozawa et al. |
| 8,017,991 B2 | 9/2011 | Kim et al. |
| 8,043,951 B2 | 10/2011 | Beugin et al. |
| 8,063,434 B1 | 11/2011 | Polishchuk et al. |
| 8,093,128 B2 | 1/2012 | Koutny et al. |
| 8,138,037 B2 | 3/2012 | Chudzik et al. |
| 8,168,493 B2 | 5/2012 | Kim |
| 8,298,885 B2 | 10/2012 | Wei et al. |
| 8,334,198 B2 | 12/2012 | Chen et al. |
| 8,372,699 B2 | 2/2013 | Kang et al. |
| 8,389,365 B2 | 3/2013 | Shroff et al. |
| 8,399,310 B2 | 3/2013 | Shroff et al. |
| 8,524,557 B1 | 9/2013 | Hall et al. |
| 8,536,006 B2 | 9/2013 | Shroff et al. |
| 8,536,007 B2 | 9/2013 | Shroff et al. |
| 8,679,927 B2 | 3/2014 | Ramkumar et al. |
| 2001/0049166 A1 | 12/2001 | Peschiaroli et al. |
| 2002/0061616 A1 | 5/2002 | Kim et al. |
| 2003/0022434 A1 | 1/2003 | Taniguchi et al. |
| 2004/0075133 A1 | 4/2004 | Nakagawa et al. |
| 2004/0262670 A1 | 12/2004 | Takebuchi et al. |
| 2005/0145949 A1 | 7/2005 | Sadra et al. |
| 2006/0038240 A1 | 2/2006 | Tsutsumi et al. |
| 2006/0046449 A1 | 3/2006 | Liaw |
| 2006/0099798 A1 | 5/2006 | Nakagawa |
| 2006/0134864 A1 | 6/2006 | Higashitani et al. |
| 2006/0211206 A1 | 9/2006 | Rao et al. |
| 2006/0221688 A1 | 10/2006 | Shukuri et al. |
| 2007/0037343 A1 | 2/2007 | Colombo et al. |
| 2007/0077705 A1 | 4/2007 | Prinz et al. |
| 2007/0115725 A1 | 5/2007 | Pham et al. |
| 2007/0215917 A1 | 9/2007 | Taniguchi |
| 2007/0224772 A1 | 9/2007 | Hall et al. |
| 2007/0249129 A1 | 10/2007 | Hall et al. |
| 2007/0264776 A1 | 11/2007 | Dong et al. |
| 2008/0029805 A1 | 2/2008 | Shimamoto et al. |
| 2008/0050875 A1 | 2/2008 | Moon et al. |
| 2008/0067599 A1 | 3/2008 | Tsutsumi et al. |
| 2008/0105945 A1 | 5/2008 | Steimle et al. |
| 2008/0121983 A1 | 5/2008 | Seong et al. |
| 2008/0128785 A1 | 6/2008 | Park et al. |
| 2008/0145985 A1 | 6/2008 | Chi |
| 2008/0185635 A1 | 8/2008 | Yanagi et al. |
| 2008/0237690 A1 | 10/2008 | Anezaki et al. |
| 2008/0237700 A1 | 10/2008 | Kim et al. |
| 2008/0283900 A1 | 11/2008 | Nakagawa et al. |
| 2008/0290385 A1 | 11/2008 | Urushido |
| 2008/0308876 A1 | 12/2008 | Lee et al. |
| 2009/0050955 A1 | 2/2009 | Akita et al. |
| 2009/0065845 A1 | 3/2009 | Kim et al. |
| 2009/0072274 A1 | 3/2009 | Knoefler et al. |
| 2009/0078986 A1 | 3/2009 | Bach |
| 2009/0101961 A1 | 4/2009 | He et al. |
| 2009/0111229 A1 | 4/2009 | Steimle et al. |
| 2009/0179283 A1 | 7/2009 | Adams et al. |
| 2009/0225602 A1 | 9/2009 | Sandhu et al. |
| 2009/0256211 A1 | 10/2009 | Booth, Jr. et al. |
| 2009/0269893 A1 | 10/2009 | Hashimoto et al. |
| 2009/0273013 A1 | 11/2009 | Winstead et al. |
| 2009/0278187 A1 | 11/2009 | Toba |
| 2011/0031548 A1 | 2/2011 | White et al. |
| 2011/0095348 A1 | 4/2011 | Chakihara et al. |
| 2011/0204450 A1 | 8/2011 | Moriya |
| 2011/0260258 A1 | 10/2011 | Zhu et al. |
| 2012/0034751 A1 | 2/2012 | Ariyoshi et al. |
| 2012/0104483 A1 | 5/2012 | Shroff et al. |
| 2012/0132978 A1 | 5/2012 | Toba et al. |
| 2012/0142153 A1 | 6/2012 | Jeong |
| 2012/0248523 A1 | 10/2012 | Shroff et al. |
| 2012/0252171 A1 | 10/2012 | Shroff et al. |
| 2013/0026553 A1 | 1/2013 | Horch |
| 2013/0037886 A1 | 2/2013 | Tsai et al. |
| 2013/0065366 A1 | 3/2013 | Thomas et al. |
| 2013/0084684 A1 | 4/2013 | Ishii et al. |
| 2013/0137227 A1 | 5/2013 | Shroff et al. |
| 2013/0171785 A1 | 7/2013 | Shroff et al. |
| 2013/0171786 A1 | 7/2013 | Shroff et al. |
| 2013/0178027 A1 | 7/2013 | Hall et al. |
| 2013/0178054 A1 | 7/2013 | Shroff et al. |
| 2013/0264633 A1 | 10/2013 | Hall et al. |
| 2013/0264634 A1 | 10/2013 | Hall et al. |
| 2013/0267072 A1 | 10/2013 | HALL et al. |
| 2013/0267074 A1 | 10/2013 | Hall et al. |
| 2013/0323922 A1 | 12/2013 | Shen et al. |
| 2014/0035027 A1 | 2/2014 | Chakihara et al. |
| 2014/0050029 A1 | 2/2014 | Kang et al. |
| 2014/0120713 A1 | 5/2014 | Shroff et al. |

OTHER PUBLICATIONS

U.S. Appl. No. 13/928,666, Hong, Office Action—Rejection, mailed Jul. 23, 2014.
U.S. Appl. No. 14/041,662, Perera, Office Action—Restriction, mailed Aug. 1, 2014.
U.S. Appl. No. 13/969,180, Perera, Office Action—Allowance, mailed Aug. 5, 2014.
U.S. Appl. No. 13/781,727, Shroff, Office Action—Allowance, mailed Aug. 15, 2014.
U.S. Appl. No. 13/955,665, Office Action—Allowance, mailed Aug. 20, 2014.
U.S. Appl. No. 13/973,549, Hong, Office Action—Restriction, mailed Aug. 26, 2014.
U.S. Appl. No. 13/441,426, Shroff, Office Action—Allowance, mailed Sep. 26, 2014.
U.S. Appl. No. 13/661,157, Office Action—Restriction, mailed Oct. 2, 2014.
U.S. Appl. No. 14/041,662, Perera, Office Action— Allowance, mailed Oct. 17, 2014.
Office Action mailed Jan. 31, 2014 in U.S. Appl. No. 13/781,727.
U.S. Appl. No. 13/781,727, Office Action—Allowance, May 12, 2014.
U.S. Appl. No. 13/441,426, Shroff, M. D., et al., Office Action—Allowance, mailed Jun. 9, 2014.
U.S. Appl. No. 13/907,491, Office Action—Rejection, Sep. 3, 2013.
U.S. Appl. No. 13/343,331, Office Action—Allowance, Nov. 8, 2013.
Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.
Kang, T.K., et al., "Improved characteristics for Pd nanocrystal memory with stacked HfAlO-SiO2 tunnel layer", Sciencedirect.com, Solid-State Electronics, vol. 61, Issue 1, Jul. 2011, pp. 100-105, http://wwww.sciencedirect.com/science/article/pii/ S0038110111000803.
Krishnan, S., et al.., "A Manufacturable Dual Channel (Si and SiGe) High-K Metal Gate CMOS Technology with Multiple Oxides for

(56) References Cited

OTHER PUBLICATIONS

High Performance and Low Power Applications", IEEE, Feb. 2011 IEEE International Electron Devices Meeting (IEDM), 28.1.1-28.1. 4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao, P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

Wang, X.P., et al., Dual Metal Gates with Band-Edge Work Functions on Novel HfLaO High-K Gate Dielectric, IEEE, Symposium on VLSI Technology Digest of Technical Papers, 2006.

U.S. Appl. No. 13/402,426, Hall, M.D., et al., "Non-Volatile Memory Cell and Logic Transistor Integration", Office Action—Allowance—May 3, 2013.

U.S. Appl. No. 13/789,971, Hall, M.D., et al, "Integration Technique Using Thermal Oxide Select Gate Dielectric for Select Gate and Replacement Gate for Logic", Office Action—Allowance—May 15, 2013.

U.S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.

U.S. Appl. No. 13/442,142, Hall, M.D., et al., "Logic Transistor and Non-Volatile Memory Cell Integration", Office Action—Ex Parte Quayle, Apr. 4, 2013.

U.S. Appl. No. 13/442,142, Hall, M.D., et al., "Logic Transistor and Non-Volatile Memory Cell Integration", Office Action—Allowance, Aug. 2, 2013.

U.S. Appl. No. 13/907,491, Hall, M.D., et al., "Logic Transistor and Non-Volatile Memory Cell Integration", Office Action—Rejection, Sep. 13, 2013.

U.S. Appl. No. 12/915,726, Shroff, M., et al., "Non-Volatile Memory and Logic Circuit Process Integration", Office Action—Restriction, Jul. 31, 2012.

U.S. Appl. No. 12/915,726, Shroff, M., et al., "Non-Volatile Memory and Logic Circuit Process Integration", Office Action—Allowance, Dec. 10, 2012.

U.S. Appl. No. 13/781,727, Shroff, M., et al., "Methods of Making Logic Transistors and non-Volatile Memory Cells", Office Action—Rejection, Aug. 22, 2013.

U.S. Appl. No. 13/077,491, Shroff, M.., et al., "Non-Volatile Memory and Logic Circuit Process Integration", Office Action—Rejection, Aug. 15, 2012.

U.S. Appl. No. 13/077,491, Shroff, M.., et al., "Non-Volatile Memory and Logic Circuit Process Integration", Office Action—Rejection, Feb. 6, 2013.

U.S. Appl. No. 13/077,491, Shroff, M.., et al., "Non-Volatile Memory and Logic Circuit Process Integration", Office Action—Allowance, Jun. 18, 2013.

U.S. Appl. No. 13/077,501, Shroff, M.., et al., "Non-Volatile Memory and Logic Circuit Process Integration", Office Action—Allowance, Nov. 26, 2012.

U.S. Appl. No. 13/313,179, Shroff, M., et al., "Method of Protecting Against Via Failure and Structure Therefor", Office Action—Rejection, Aug. 15, 2013.

U.S. Appl. No. 13/307,719, Shroff, M., et al., "Logic and Non-Volatile Memory (NVM) Integration", Office Action—Allowance, May 29, 2013.

U.S. Appl. No. 13/343,331, Shroff, M., et al., "Non-Volatile Memory (NVM) and Logic Integration", Office Action—Rejection, Mar. 13, 2013.

U.S. Appl. No. 13/343,331, Shroff, M., et al., "Non-Volatile Memory (NVM) and Logic Integration", Office Action—Allowance, Jun. 24, 2013.

U.S. Appl. No. 13/441,426, Shroff, M., et al., "Non-Volatile Memory (NVM) and Logic Integration", Office Action—Allowance, Sep. 9, 2013.

U.S. Appl. No. 13/780,574, Hall, M.D., et al., Non-Volatile Memory (NVM) and Logic Integration, Office Action—Allowance, Sep. 6, 2013.

U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.

U.S. Appl. No. 13/491,771, Hall, M., et al., "Integrating Formation of a Replacement Gate Transistor and a Non-Volatile Memory Cell Using a High-K Dielectric", filed Jun. 8, 2012.

U.S. Appl. No. 13/790,225, Hall, M., et al., "Integrating Formation of a Replacement Gate Transistor and a non-Volatile Memory Cell Having Thin Film Storage", filed Mar. 8, 2013.

U.S. Appl. No. 13/790,014, Hall, M., et al., "Integrating Formation of a Logic Transistor and a None-Volatile Memory Cell Using a Partial Replacement Gate Technique", filed Mar. 8, 2013.

U.S. Appl. No. 13/955,665, Perera, A.H., "Non-Volatile Memory (NVM) and High K and Metal Gate Integration Using Gate First Methodology", filed Jul. 31, 2013.

U.S. Appl. No. 13/971,987, Perera, A.H., et al., "Integrated Split Gate Non-Volatile Memory Cell and Logic Structure", filed Aug. 21, 2013.

U.S. Appl. No. 13/972,372, Perera, A.H., et al., "Integrated Split Gate Non-Volatile Memory Cell and Logic Device", filed Aug. 21, 2013.

U.S. Appl. No. 13/962,338, Perera, A.H., "Nonvolatile Memory Bitcell With Inlaid High K Metal Select Gate", filed Aug. 8, 2013.

U.S. Appl. No. 13/928,666, Hong, C. M., et al., "Non-Volatile Memory (NVM) and High Voltage Transistor Integration", filed Jun. 27, 2013.

U.S. Appl. No. 13/969,180, Perera, A.H., et al., "Non-Volatile Memory (NVM) Cell, High Voltage Transistor, and High-K and Metal Gate Transistor Integration", filed Aug. 16, 2013.

U.S. Appl. No. 13/973,549, Hong, C.M., et al., "Split-Gate non-Volatile Memory (NVM) Cell and Device Structure Integration", filed Aug. 22, 2013.

U.S. Appl. No. 13/780,591, Hall, M.D., et al., "Non-Volatile Memory (NVM) and Logic Integration", filed Feb. 28, 2013.

U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.

U.S. Appl. No. 13/661,157, Shroff, M.D., et al., "Method of Making a Logic Transistor and a Non-Volatile Memory (NVM) Cell", file Oct. 26, 2012.

U.S. Appl. No. 13/781,727, Shroff, M., et al., "Methods of Making Logic Transistors and non-Volatile Memory Cells", Office Action—Restriction, Jun. 21, 2013.

Office Action—Allowance mailed Feb. 21, 2014 in U.S. Appl. No. 13/441,426.

Office Action—Allowance mailed Feb. 28, 2014 in U.S. Appl. No. 13/442,142.

Office Action—Allowance mailed Mar. 3, 2014 in U.S. Appl. No. 13/790,014.

Office Action—Allowance mailed Mar. 6, 2014 in U.S. Appl. No. 13/491,771.

Office Action—Allowance mailed Mar. 11, 2014 in U.S. Appl. No. 13/907,491.

Office Action—Allowance mailed Mar. 12, 2014 for U.S. Appl. No. 13/790,225.

Office Action mailed Dec. 24, 2013 in U.S. Appl. No. 13/790,225.
Office Action mailed Dec. 24, 2013 in U.S. Appl. No. 13/790,014.
Office Action mailed Dec. 31, 2013 in U.S. Appl. No. 13/442,142.
Office Action mailed Jan. 16, 2014 in U.S. Appl. No. 13/491,771.

* cited by examiner

NON-VOLATILE MEMORY (NVM) CELL AND HIGH-K AND METAL GATE TRANSISTOR INTEGRATION

CROSS-REFERENCE TO RELATED APPLICATIONS

This application is related to U.S. patent application Ser. No. 13/955,665, filed on Jul. 31, 2013, titled "NON-VOLATILE MEMORY (NVM) AND HIGH-K AND METAL GATE INTEGRATION USING GATE-FIRST METHODOLOGY," naming Asanga H. Perera as inventor, and assigned to the current assignee hereof.

This application is related to U.S. patent application Ser. No. 13/969,180, filed on Aug. 16, 2013, titled "NON-VOLATILE MEMORY (NVM) CELL, HIGH VOLTAGE TRANSISTOR, AND HIGH-K AND METAL GATE TRANSISTOR INTEGRATION," naming Asanga H. Perera, Cheong M. Hong, and Sung-Taeg Kang as inventors, and assigned to the current assignee hereof.

BACKGROUND

1. Field

This disclosure relates generally to non-volatile memory (NVM) cells and other transistor types, and more particularly, integrating NVM cells with logic transistors that have high k gate dielectrics and metal gates.

2. Related Art

The integration of non-volatile memories (NVMs) with logic transistors has always been a challenge due to the different requirements for the NVM transistors, which store charge, and the logic transistors which are commonly intended for high speed operation. The need for storing charge has been addressed mostly with the use of floating gates but also with nanocrystals or nitride. In any of these cases, the need for this unique layer makes integration of the NVM transistors and the logic transistors difficult. The particular type of charge storage layer can also have a large effect on the options that are available in achieving the integration. A further complication is when the logic transistors are high k, metal gate transistors and high voltage transistors. The high k gate dielectrics typically cannot withstand the high temperatures that are generally best for NVM cells and for high voltage transistors. Further the high voltage transistors typically have relatively thick layers of oxide for the gate dielectrics that, when etched, can cause a corresponding recess of the isolation oxide exposing the sidewall surface of logic transistor channel regions. The exposure of the transistor region sidewall surface makes it difficult to control the threshold voltage of the transistors and accordingly makes for a leakage problem for those transistors.

Accordingly there is a need to provide an integration that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an integration of a non-volatile memory (NVM) cell in a NVM region of an integrated circuit and a logic transistor in a logic region of the integrated circuit includes forming the gate structure of the NVM cell in the NVM region, including the charge storage layer, while masking the logic region using a polysilicon layer used in forming the select gate in the NVM cell. A well for the logic transistor is not formed until after removing the polysilicon layer from the logic region. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer unless otherwise noted. Similarly, nitride layer refers to a silicon nitride layer unless otherwise noted.

Figure 1:
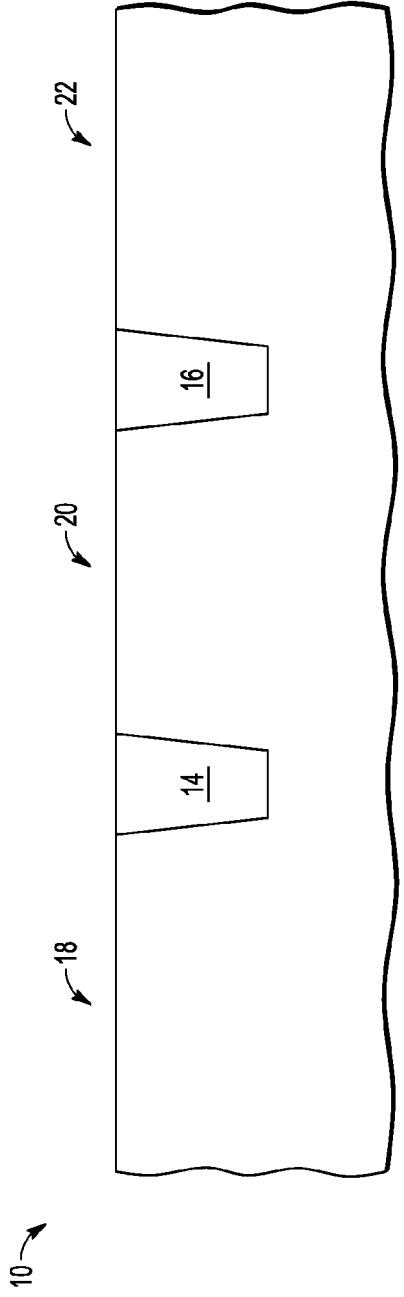
FIG. 1 is a cross section of a semiconductor structure having a non-volatile memory (NVM) structure and a logic transistor structure at a stage in processing according to an embodiment.

Shown in FIG. 1 is a semiconductor structure 10 of an integrated circuit having a substrate 12, an isolation region 14 in substrate 12, and an isolation region 16 in substrate 12. An NVM region 18 of semiconductor structure 10 is bordered on one side by isolation region 14, a high voltage region 20 is between isolation regions 14 and 16, and a logic region 22 is on a side of isolation region 16 away from isolation regions 14 and 16.

Figure 2:
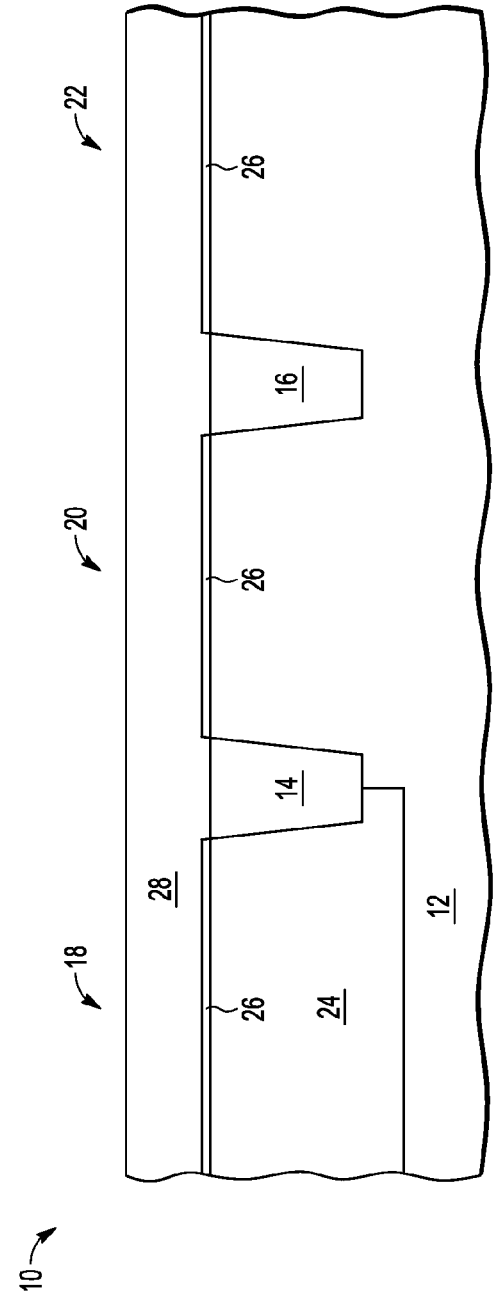
FIG. 2 is a cross section of the semiconductor structure of FIG. 1 at a subsequent stage in processing.

Shown in FIG. 2 is semiconductor structure 10 after forming a well 24 in substrate 12 in NVM region 18. Well 24 may be P type and is formed by implanting. After forming well 24, an oxide layer 26 is grown on substrate 12 in NVM region 18, high voltage region 20, and logic region 22. A polysilicon layer 28 is formed on isolation regions 14 and 16 and on oxide layer 26 in NVM region 18, high voltage region 20, and logic region 22. Polysilicon layer 28 may be 600-800 Angstroms thick. Oxide layer 26 is grown to be high quality and be grown at a temperature of 900 degrees Celsius or even more. Background doping of substrate 12 may be sufficient so that well 24 may not be needed.

Figure 3:
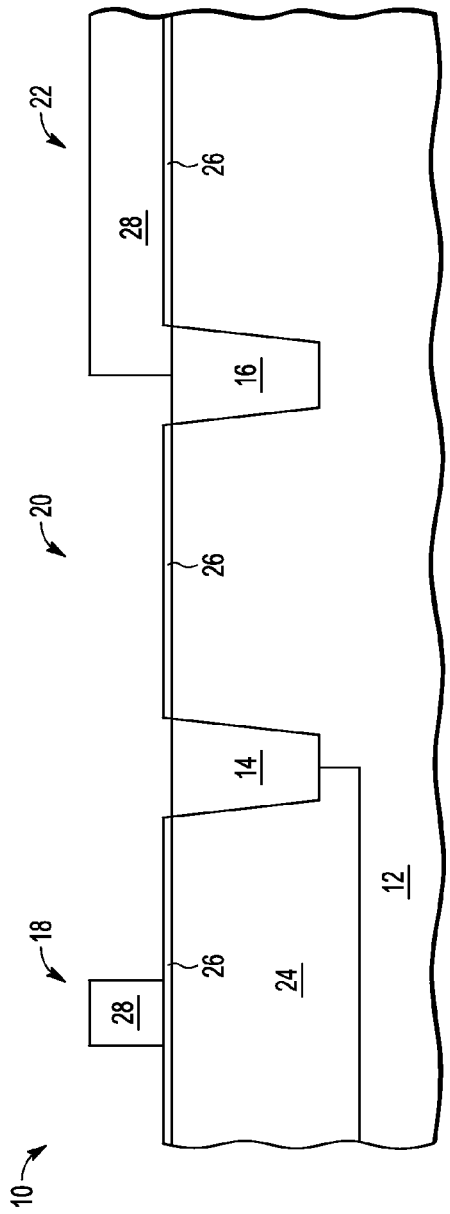
FIG. 3 is a cross section of the semiconductor structure of FIG. 2 at a subsequent stage in processing.

Shown in FIG. 3 is semiconductor structure 10 after patterning polysilicon layer 28 to leave a portion of polysilicon layer 28 useful as a select gate over oxide layer 26 in NVM region 18 and a portion of polysilicon layer 28 covering logic region 22. Polysilicon layer 28 is completely removed from high voltage region 20. This patterning, as is common for patterned etches, uses photoresist as a mask. The portion of polysilicon in NVM region 18 may be referenced as select gate 28. Similarly, the portion of polysilicon layer 28 that covers logic region 22 may be referenced as protection layer 28.

Figure 4:
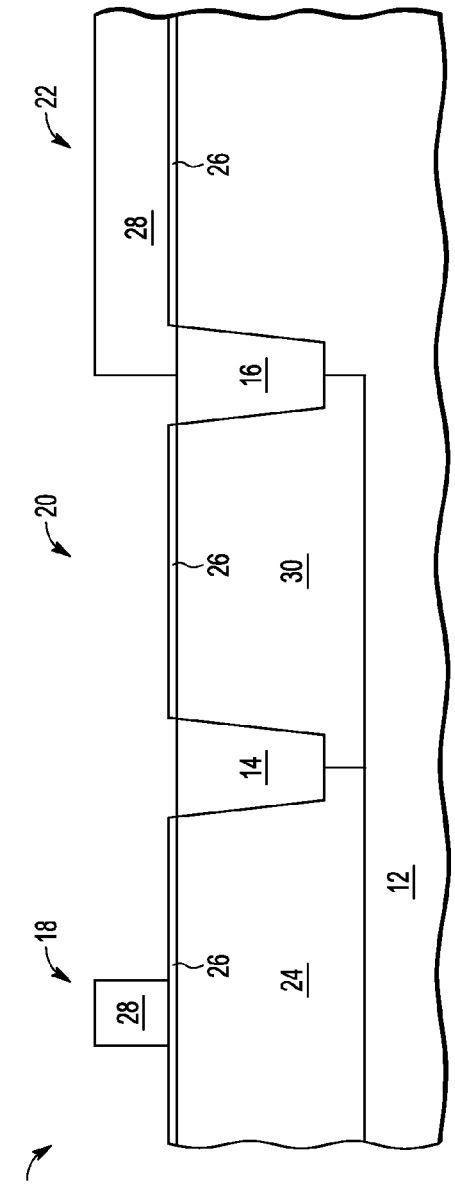
FIG. 4 is a cross section of the semiconductor structure of FIG. 3 at a subsequent stage in processing.

Shown in FIG. 4 is semiconductor structure 10 after forming a well 30 in substrate 12 in high voltage region 20. The implant for both wells 24 and 30 may be deeper than isolation regions 14 and 16.

Figure 5:
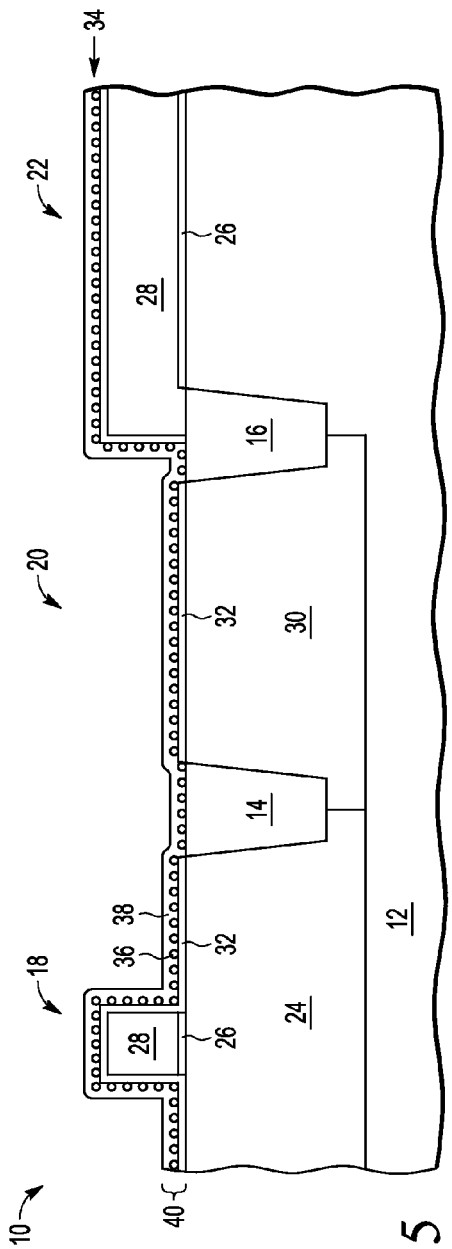
FIG. 5 is a cross section of the semiconductor structure of FIG. 4 at a subsequent stage in processing.

Shown in FIG. 5 is semiconductor structure 10 after forming a charge storage layer 40 over NVM region 18, high voltage region 20, logic region 22, isolation region 14, and isolation region 16, including over select gate 28 in NVM region 18 and protection layer 28 in logic region 22. In forming charge storage layer 40, a bottom oxide layer 32 is thermally grown on substrate 12, select gate 28, and protection layer 28. A nanocrystal layer 34, of which a nanocrystal 36 is a representative one, is formed on bottom oxide layer 32. An oxide layer 38 is formed around and over nanocrystal layer 36. A stack containing oxide and nitride may be found to be an effective charge storage layer also.

Figure 6:
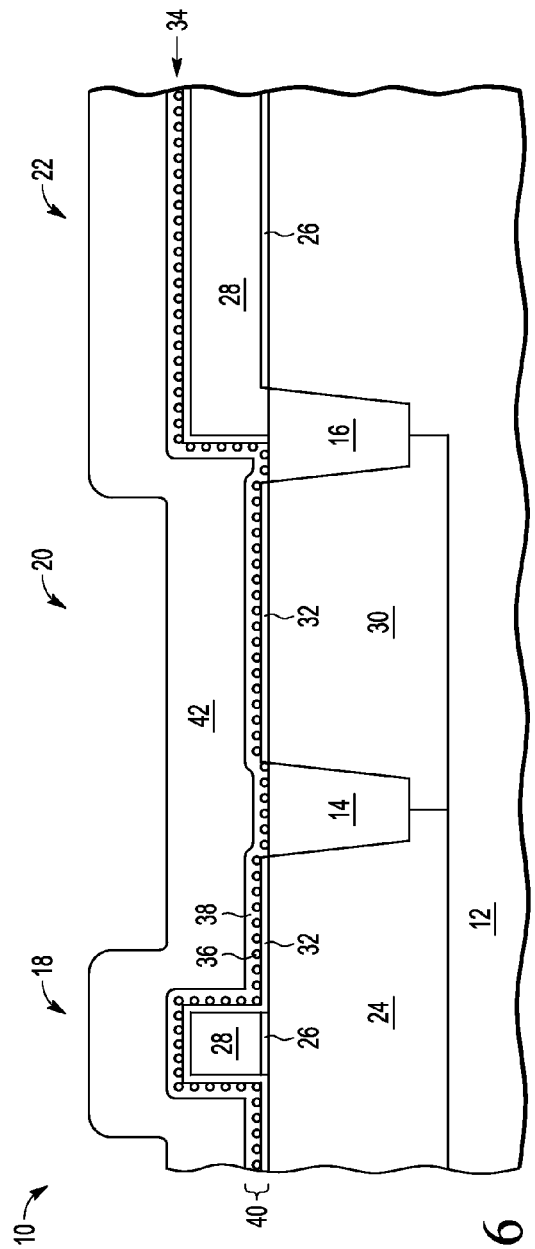
FIG. 6 is a cross section of the semiconductor structure of FIG. 5 at a subsequent stage in processing.

Shown in FIG. 6 is semiconductor structure 10 after forming a polysilicon layer 42 over charge storage layer 40.

Figure 7:
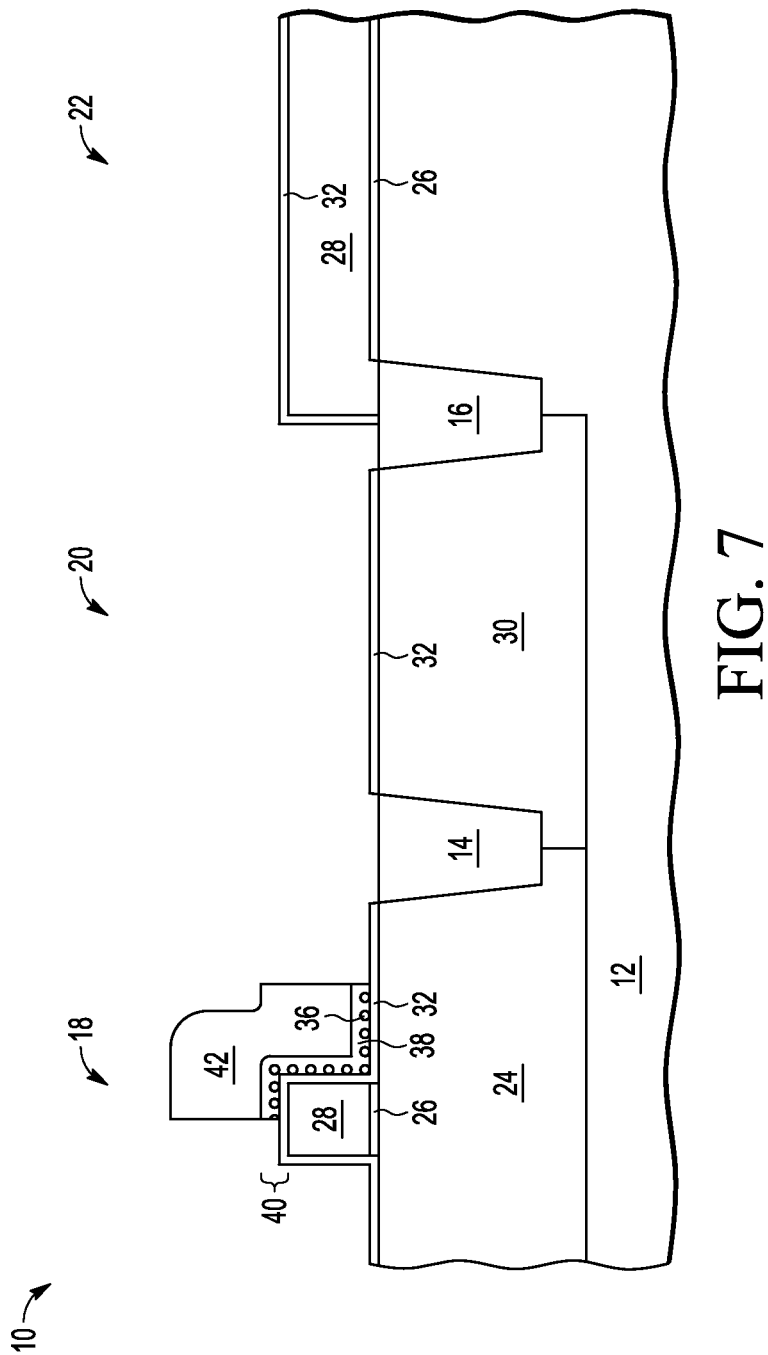
FIG. 7 is a cross section of the semiconductor structure of FIG. 6 at a subsequent stage in processing.

Shown in FIG. 7 is semiconductor structure 10 after patterning polysilicon layer 42 and charge storage layer 40 down to bottom oxide layer 32. This patterning leaves a portion of polysilicon layer 42 in NVM region 18 as a control gate which may be referenced as control gate 42. Charge storage layer 40 is between substrate 12 and control gate 42 and between select gate 28 and control gate 42. Charge storage layer 40 is over a top portion of select gate 28, along a first sidewall of select gate 28, and over a portion of substrate 12 adjacent to the first sidewall of select gate 28. The patterning extends to but not through bottom oxide layer 32 so that bottom oxide layer 32 has a top surface exposed where it is on substrate 12 and not covered by select gate 28 or control gate 42, on substrate 12 in high voltage region 20, and on a top surface of protection layer 28. Some additional portion of charge storage layer 40 may be on the sidewall of protection layer 28.

Figure 8:
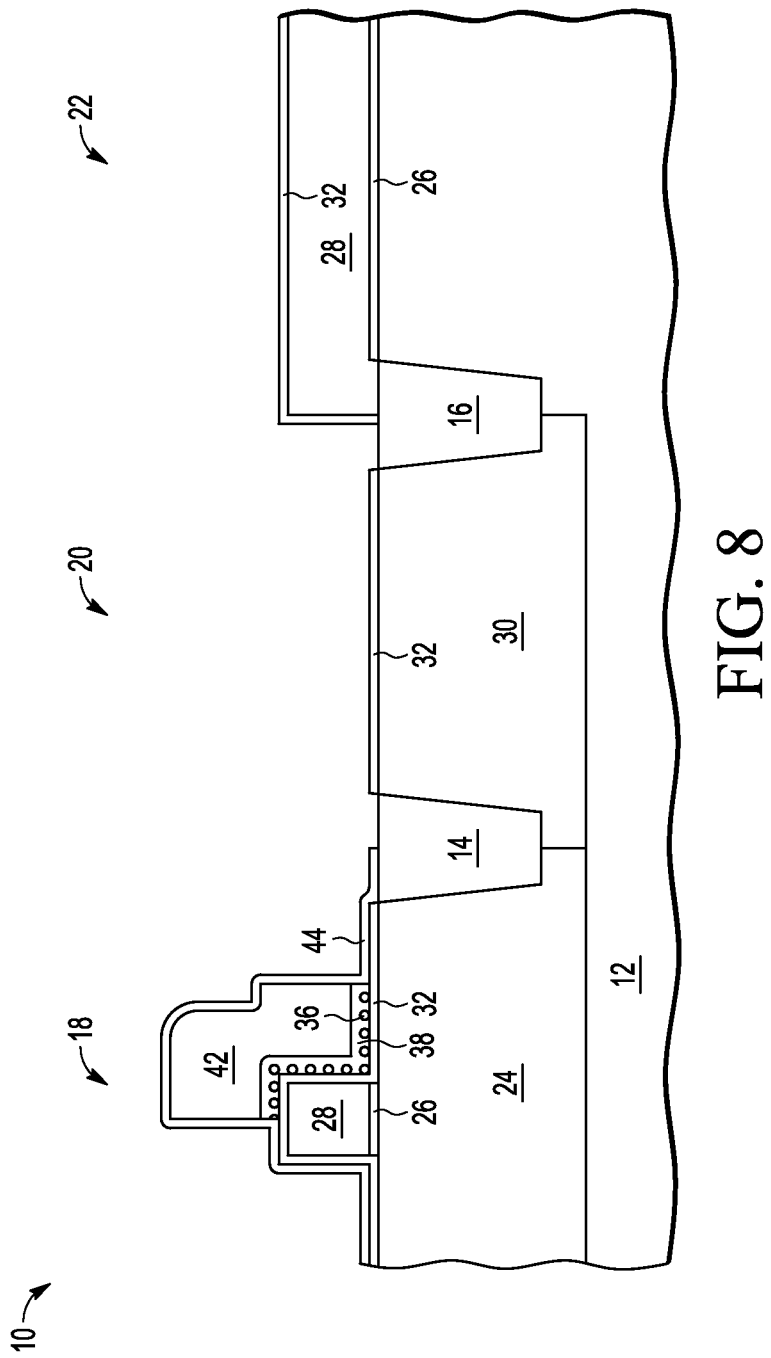
FIG. 8 is a cross section of the semiconductor structure of FIG. 7 at a subsequent stage in processing.

Shown in FIG. 8 is semiconductor structure 10 after forming a protection layer 44 over NVM region 18. Protection layer 44 may contain nitride. One example is for protection layer 44 to be an oxide-nitride-oxide (ONO) stack of layers. Thus, an ONO layer may be deposited on semiconductor structure 10 and then removed from high voltage region 20 and logic region 22 to leave protection layer 44. Protection layer 44 extends midway across isolation region 14.

Figure 9:
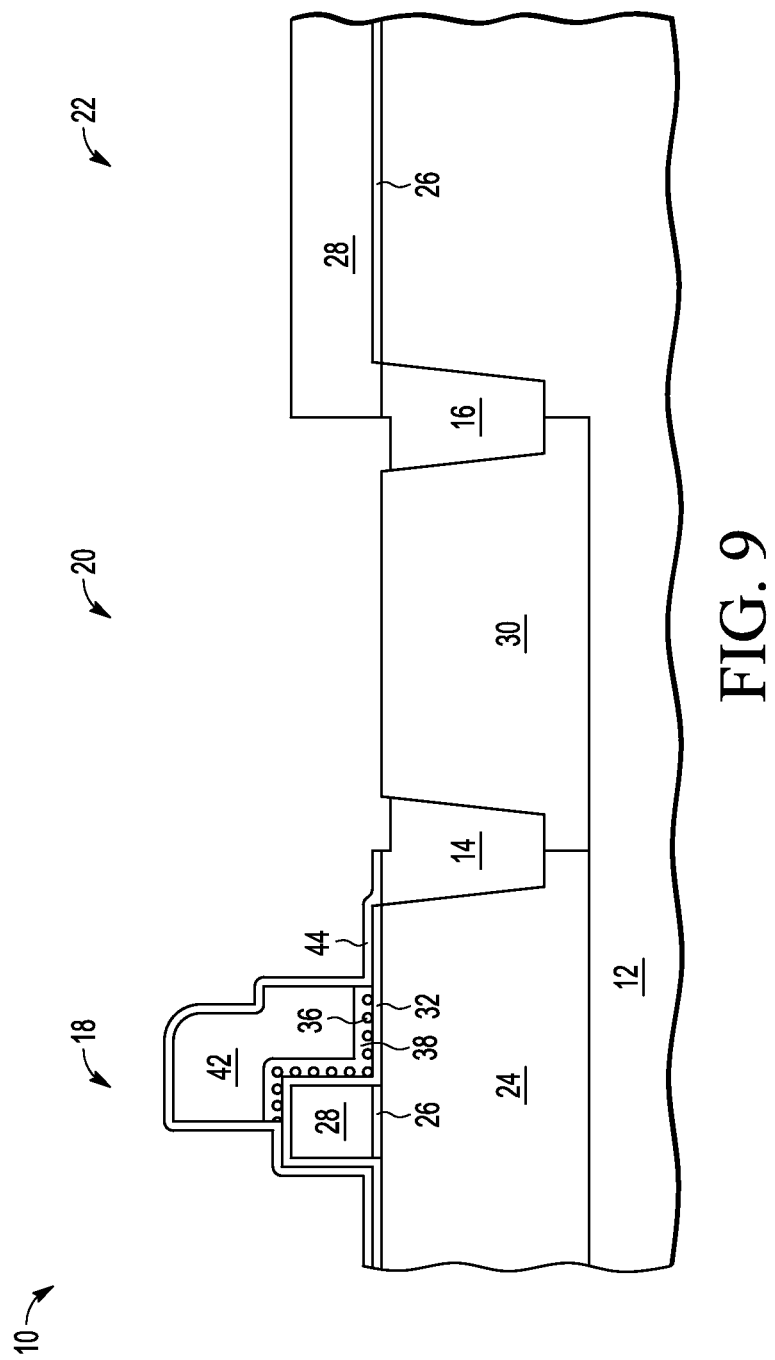
FIG. 9 is a cross section of the semiconductor structure of FIG. 8 at a subsequent stage in processing.

Shown in FIG. 9 is semiconductor structure 10 after removing bottom oxide layer 32 from high voltage region 20 and from protection layer 28. This process leaves a notch in each of isolation regions 14 and 16 on the side adjacent to high voltage region 20. No notch is formed adjacent to logic region 22 due to this etch.

Figure 10:
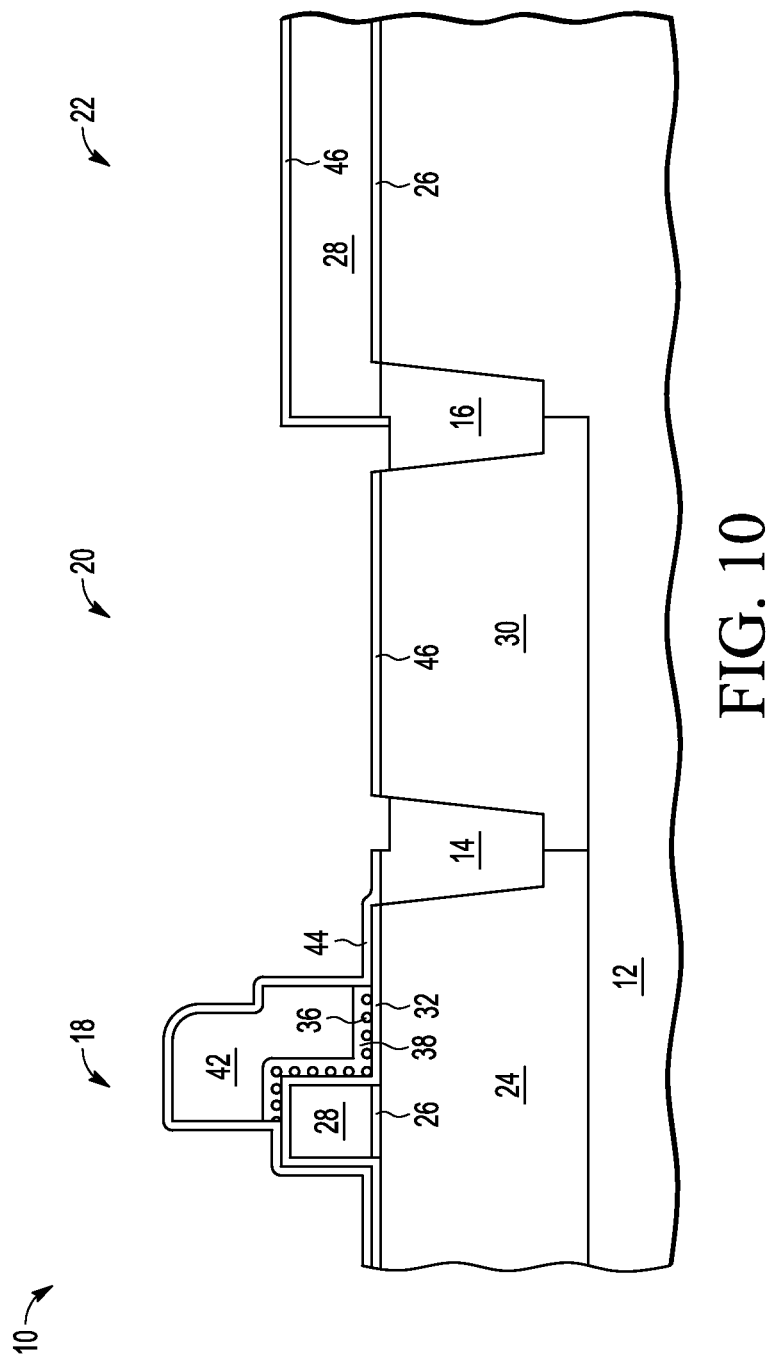
FIG. 10 is a cross section of the semiconductor structure of FIG. 9 at a subsequent stage in processing.

Shown in FIG. 10 is semiconductor structure 10 after forming an oxide layer 46 on substrate 12 in high voltage region 20 and on protection layer 28 in logic region 22. Oxide layer 46 will form a portion of a high voltage transistor to be formed in high voltage region 20. The thickness of oxide 46 is selected based on the desired voltage capability of the transistor to be formed.

Figure 11:
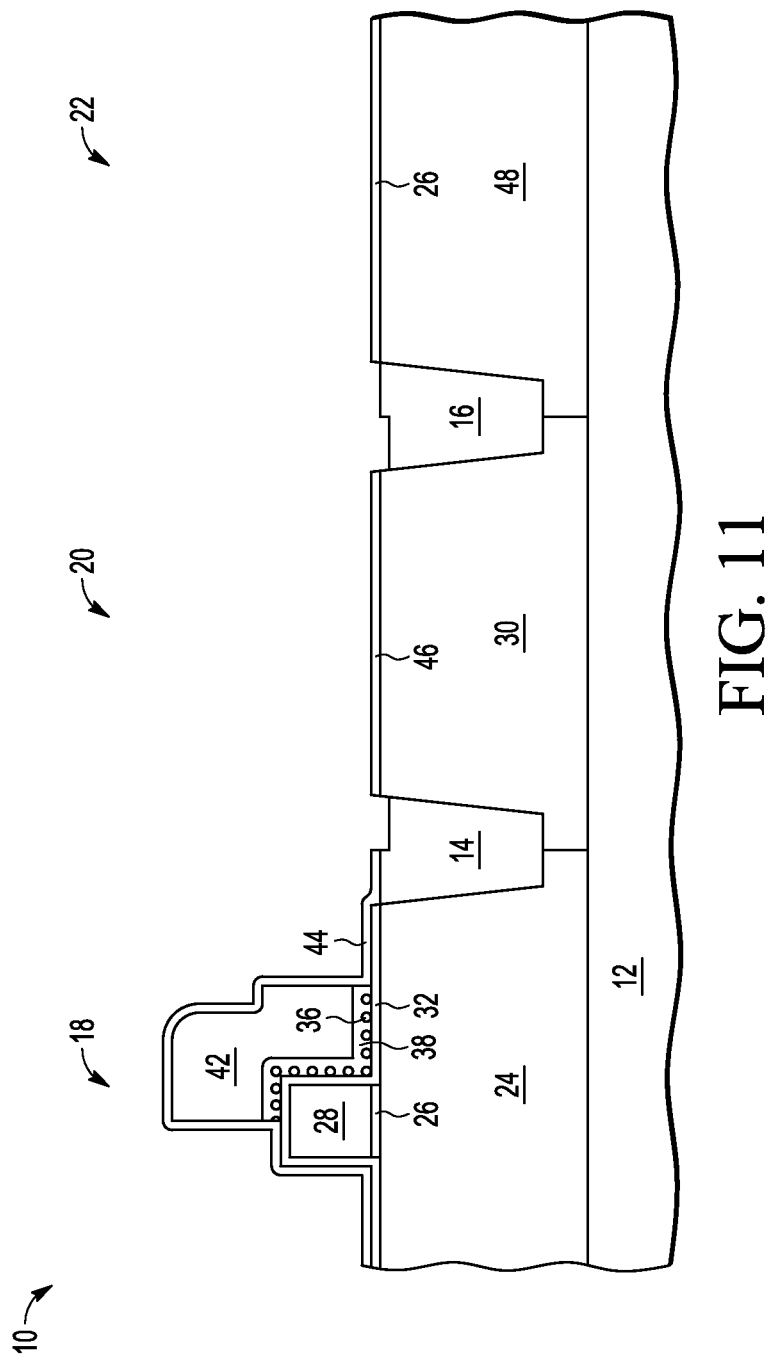
FIG. 11 is a cross section of the semiconductor structure of FIG. 10 at a subsequent stage in processing.

Shown in FIG. 11 is semiconductor structure 10 after removing oxide layer 46 on protection layer 28, removing protection layer 28, and forming a well 48 in logic region 22. This leaves oxide layer 26 on substrate 12 in logic region 22. Well 48 is thus formed after the etchings and depositions relative to NVM region 18 and high voltage region 20 have been performed. This is important in avoiding impact from the processes associated with NVM region 18 and high voltage region 20 on logic region 22. This helps avoid performance degradation for the transistors relative to the performance in an integrated circuit without embedded NVM. This helps in reuse of designs of circuits, which were originally designed for the stand alone logic integrated circuits, for use in integrated circuits that have embedded NVM.

Figure 12:
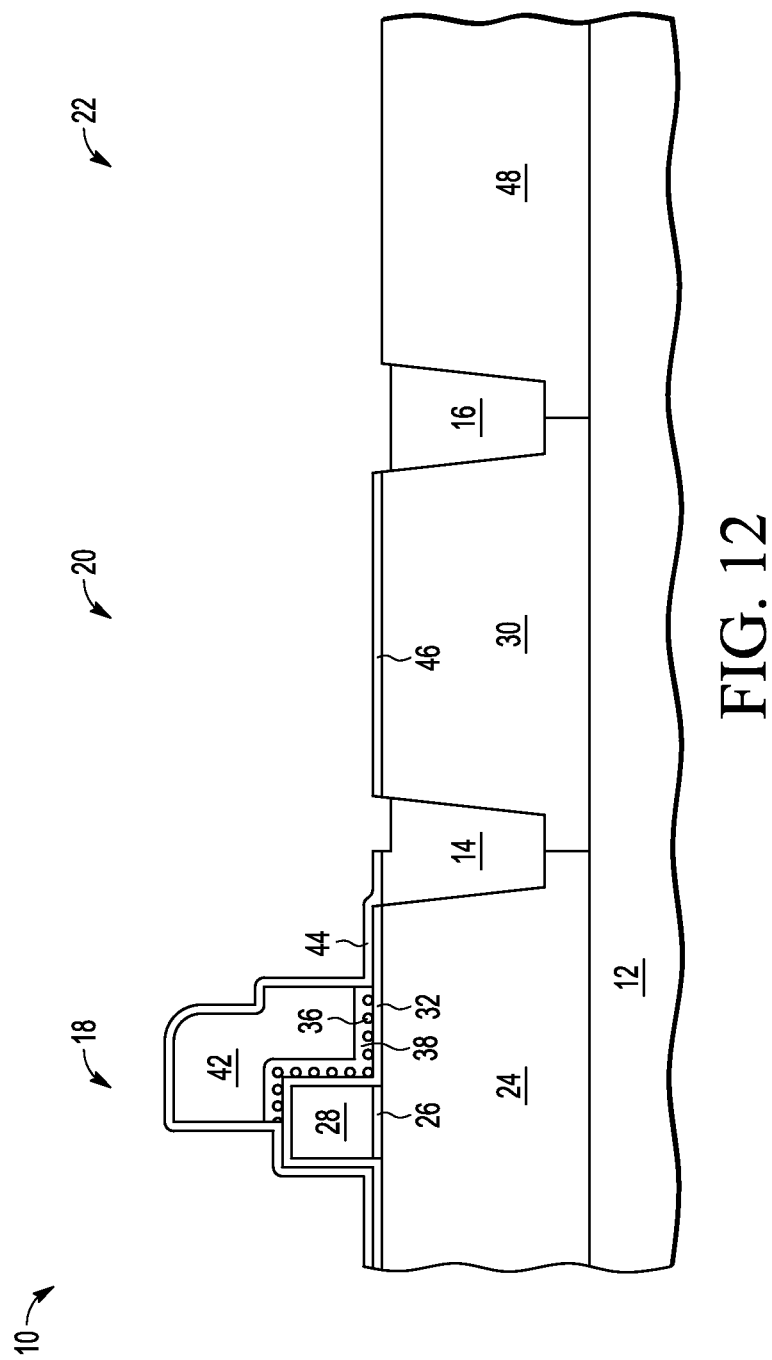
FIG. 12 is a cross section of the semiconductor structure of FIG. 11 at a subsequent stage in processing.

Shown in FIG. 12 is semiconductor structure 10 after removing oxide layer 26 from logic region 22. This has the effect of forming a notch in isolation region 16 adjacent to logic region 22. This amount of notching would be expected even if semiconductor structure 10 did not include NVM regions such as NVM region 18. There would be oxide that would need to be removed in logic region 22 prior to gate dielectric formation that would have the effect of forming a notch in the adjacent isolation region. A desirable result of the NVM processing is to result in the logic region being the same as for integrated circuits that do not have embedded NVM. The notching of the isolation affects the performance of transistors. It is very desirable for the logic transistors have the same performance for both stand alone logic integrated circuits and integrated circuits that have NVM with the logic. For example, once a logic circuit is designed and characterized, that design can be reused in different kinds of integrated circuits if the transistors have the same performance. Because the amount of notching affects transistor performance, the amount of notching should be the same or very nearly so for each application. Thus, the notching shown in FIG. 12, being at least very nearly the same as the notching for production of logic alone integrated circuits, allows for using the designs in logic integrated circuits in the integrated circuits with embedded NVM without having to do a re-design.

Figure 13:
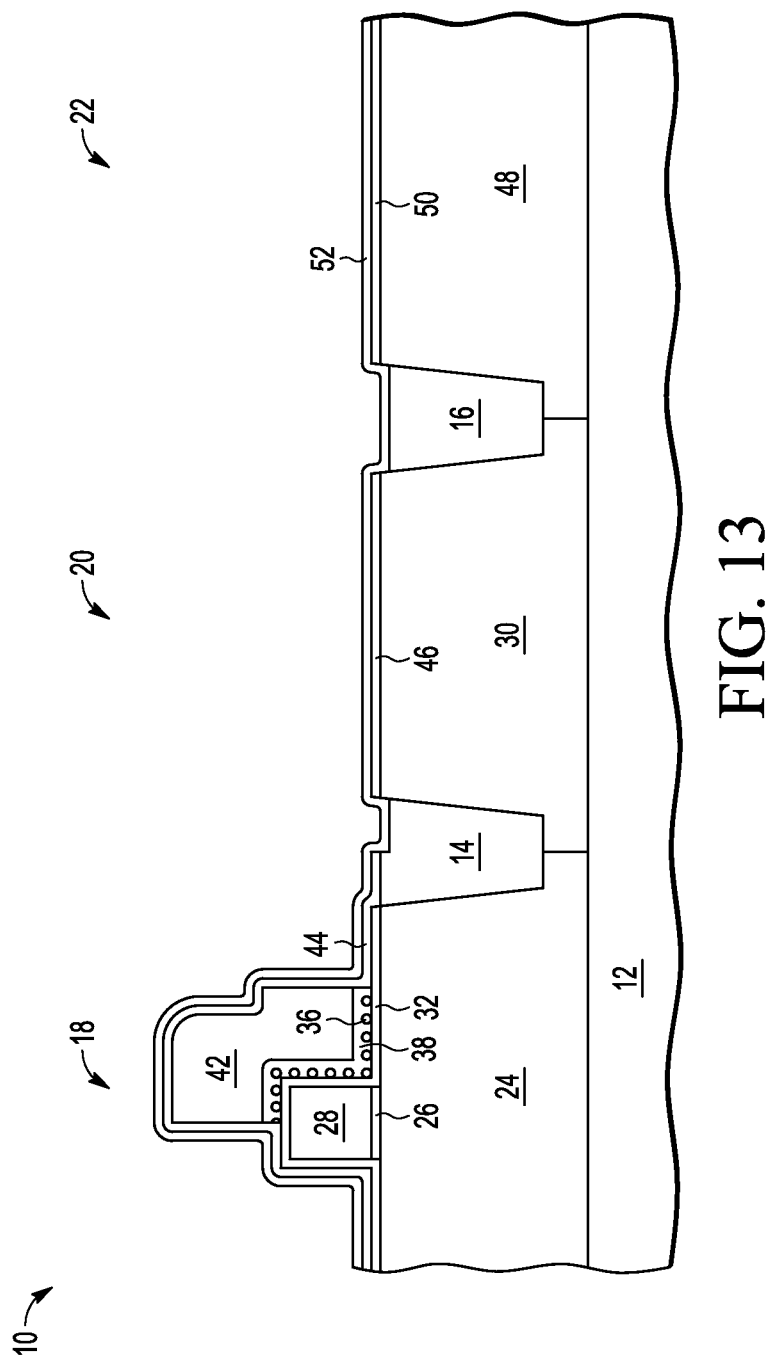
FIG. 13 is a cross section of the semiconductor structure of FIG. 12 at a subsequent stage in processing.

Shown in FIG. 13 is semiconductor structure 10 after growing a thin layer of oxide 50 on substrate 12 in logic region 22. This will also increase the thickness of oxide layer 46 in high voltage region 20 by a small amount. Also, a high k dielectric layer 52 is formed over logic region 22, high voltage region 20, and NVM region 18. Oxide layer 50 in logic region 22 may be referenced as a buffer layer.

Figure 14:
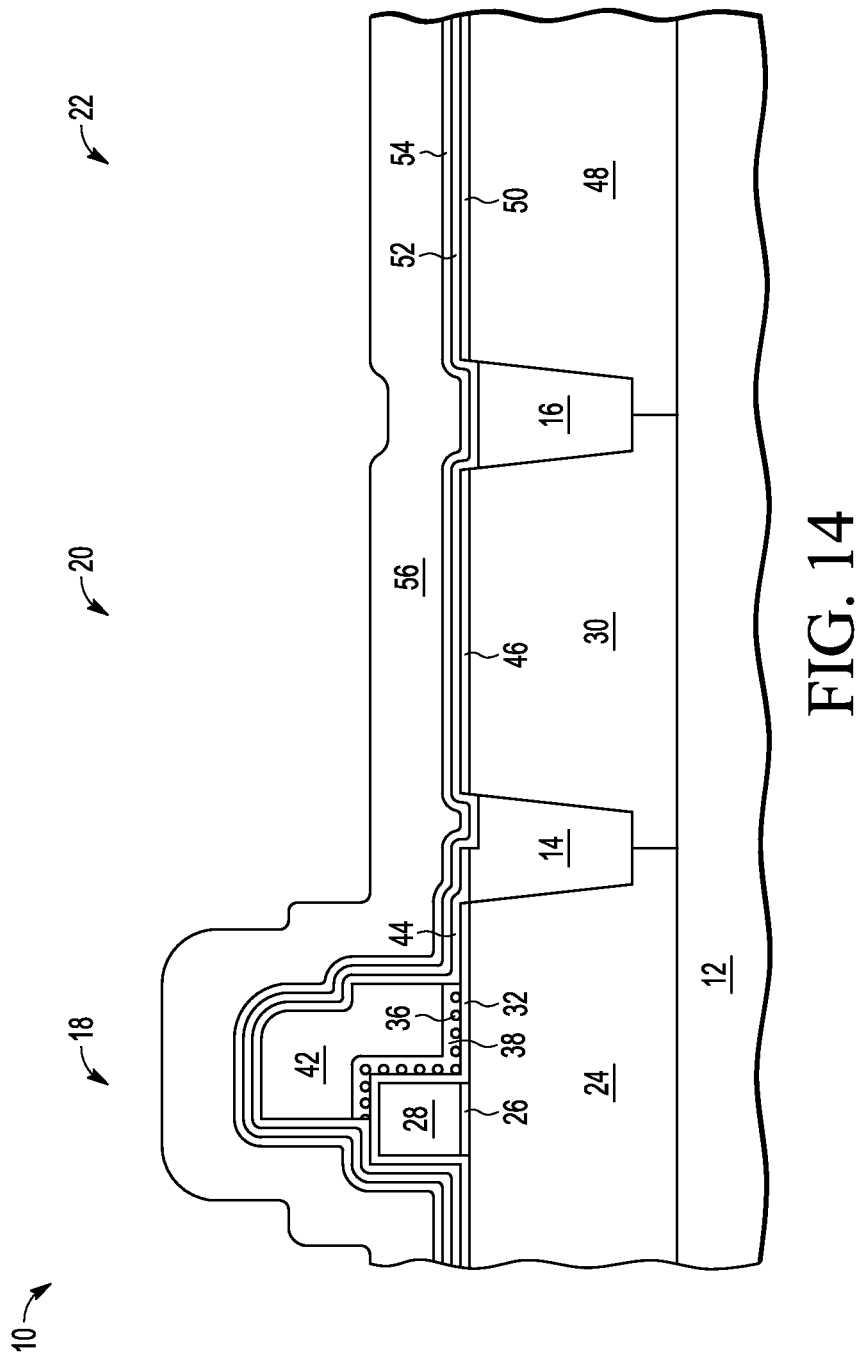
FIG. 14 is a cross section of the semiconductor structure of FIG. 13 at a subsequent stage in processing.

Shown in FIG. 14 is semiconductor structure 10 after forming a work function metal 54 over high k dielectric layer 52 in logic region 22, high voltage region 20, and NVM region 18. Various metals are known for this purpose. One class is for N channel transistors and the other for P channel transistors. All wells 24, 30, and 48 may be P type and thus for forming N channel transistors. In such case the work function setting metal would be for forming an N channel transistor. Also formed is a metal gate stack layer 56 of gate material that may contain one or more metal layers and a top polysilicon layer.

Figure 15:
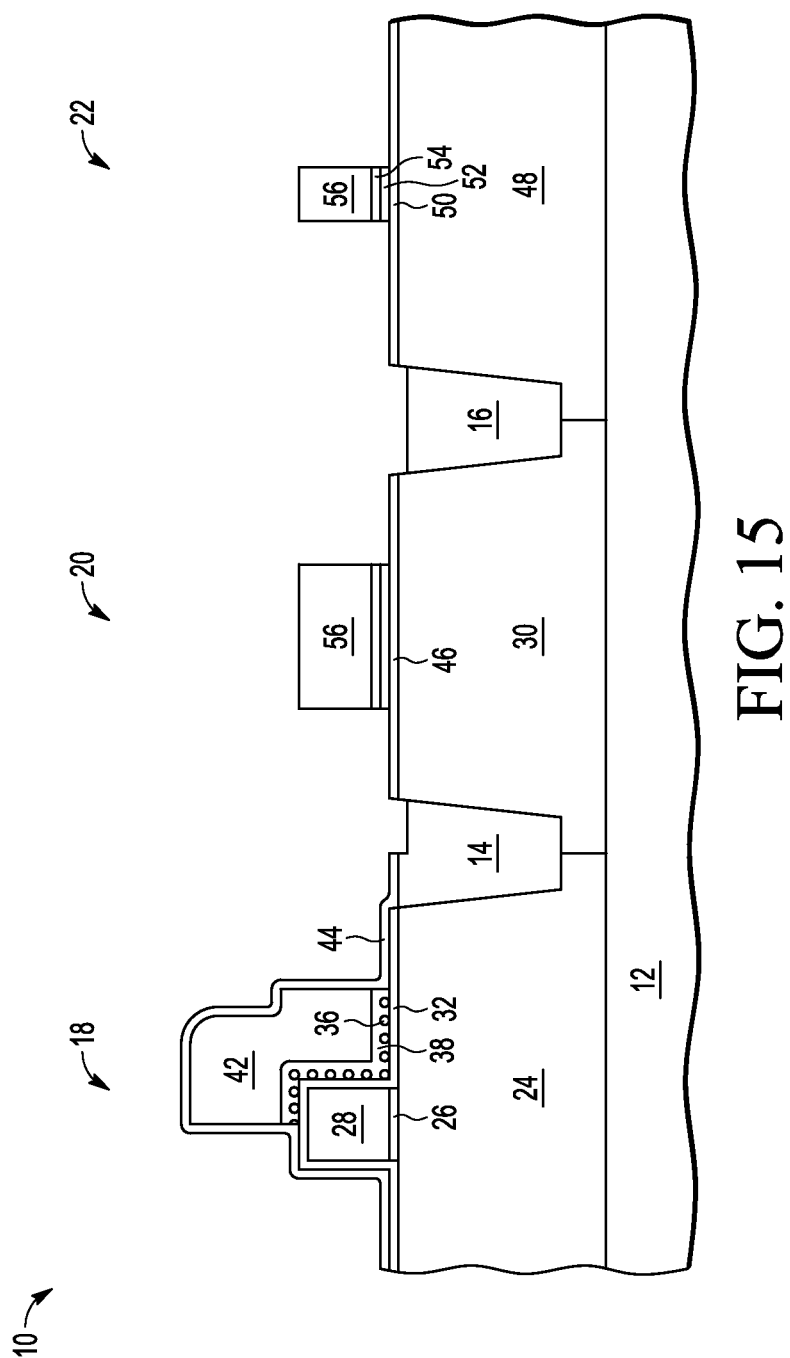
FIG. 15 is a cross section of the semiconductor structure of FIG. 14 at a subsequent stage in processing.

Shown in FIG. 15 is semiconductor structure 10 after a patterned etch of metal gate stack layer 56, work function metal 54, and high k dielectric 52 which results in a gate stack for a high voltage transistor in high voltage region 20 and a logic gate stack in logic region 22. High voltage transistors typically have relatively long gate lengths compared to logic transistors. Remaining portions of oxide layers 50 and 46 are useful in protecting the top surface of substrate 12 during subsequent source/drain implants.

Figure 16:
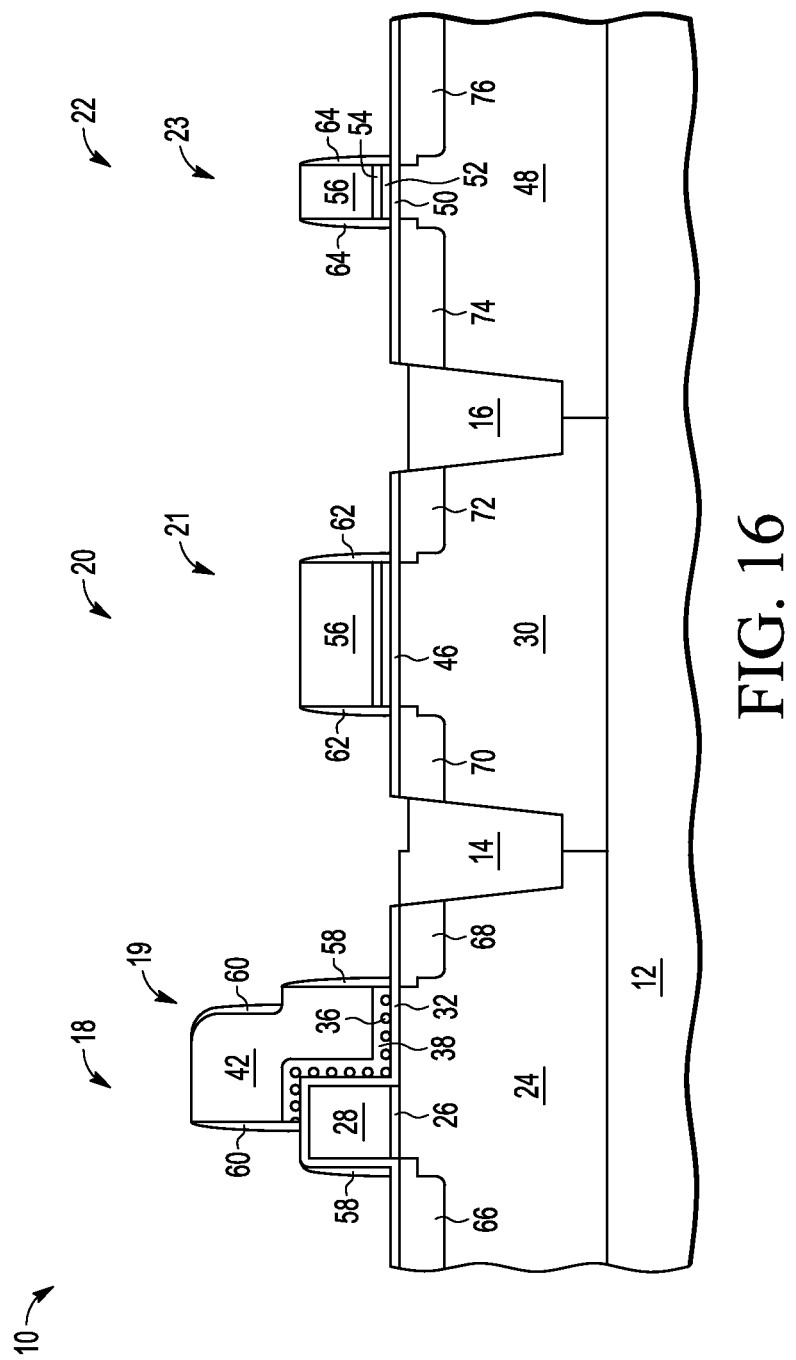
FIG. 16 is a cross section of the semiconductor structure of FIG. 15 at a subsequent stage in processing.

Shown in FIG. 16 is semiconductor structure 10 after removing protection layer 44, forming sidewall spacers, and source/drain regions to result in an NVM cell 19 in NVM region 18, a high voltage transistor 21 in high voltage region 20, and a logic transistor 23 in logic region 22. Silicide layers can now be formed over exposed substrate and poly regions. Sidewall spacers 58 and 60 are formed around select gate 28 and control gate 42 and source/drains 66 and 68 are formed in substrate 12 in NVM region 18. Sidewall spacer 62 is formed around the gate stack for the high voltage transistor to be completed in high voltage region 20, and source/drain regions 70 and 72 are formed in substrate 12 in high voltage region 20. Sidewall spacer 64 is formed around the gate stack for the logic transistor to be completed in logic region 22, and source/drain regions 74 and 76 are formed in substrate 12 in logic region 22.

Figure 17:
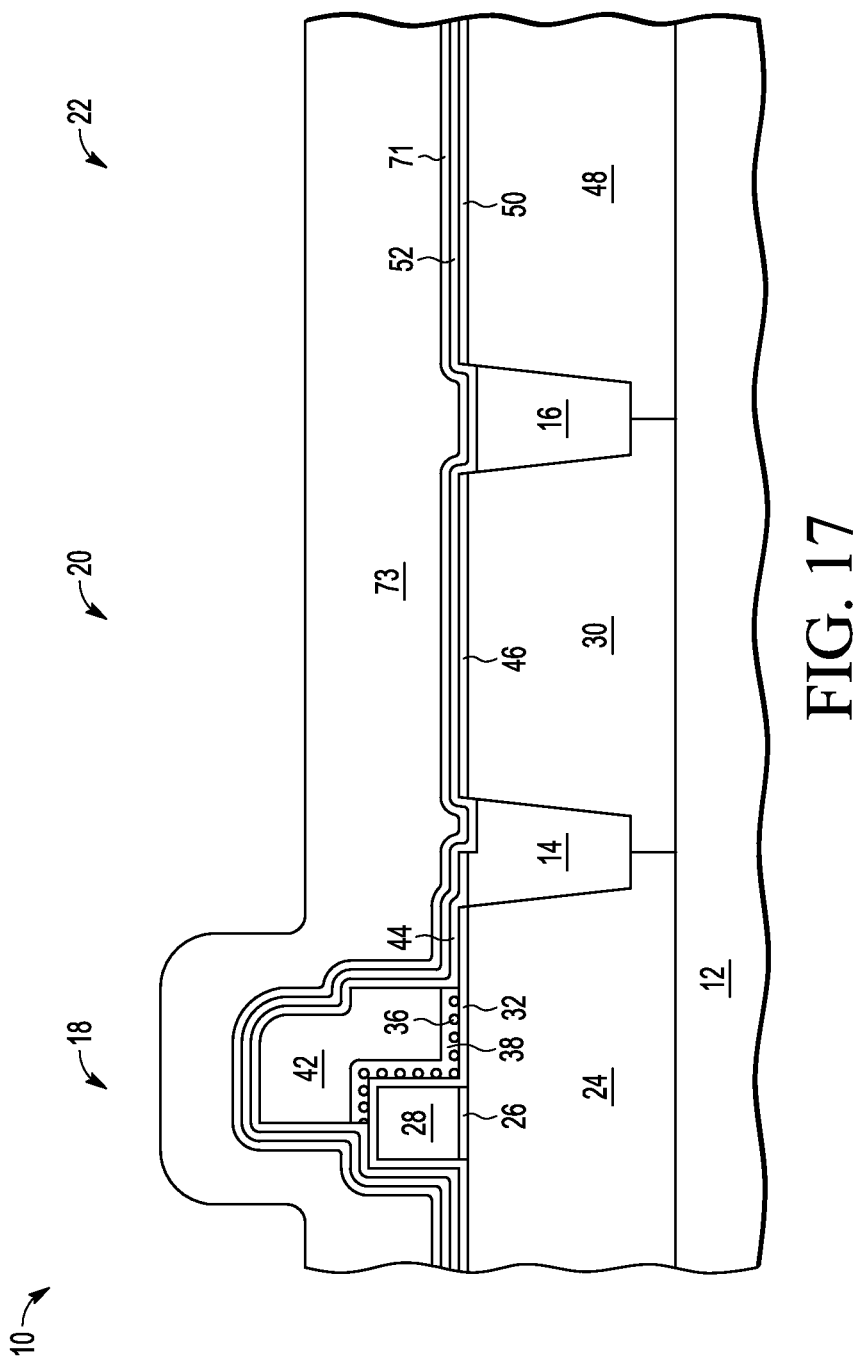
FIG. 17 is a cross section of the semiconductor structure of FIG. 13 at a subsequent stage in processing according to an alternative embodiment.

Shown in FIG. 17 is semiconductor structure 10 after forming a metal capping layer 71 on high k dielectric 52 of FIG. 13 as a step in an alternative approach to that of FIGS. 14-16. The approach of FIGS. 14-16 is in the class commonly called gate first. The approach to be described for FIGS. 17-24 is in the calls commonly called gate last. Layer 71 is a metallic layer that will be combined with another metal layer that together will set the work function. Also formed is a layer 73 which is to be used in forming a dummy gate that will subsequently be replaced by the metal gate stack. Layer 73 may be polysilicon with a relatively thin layer of oxide on its top surface.

Figure 18:
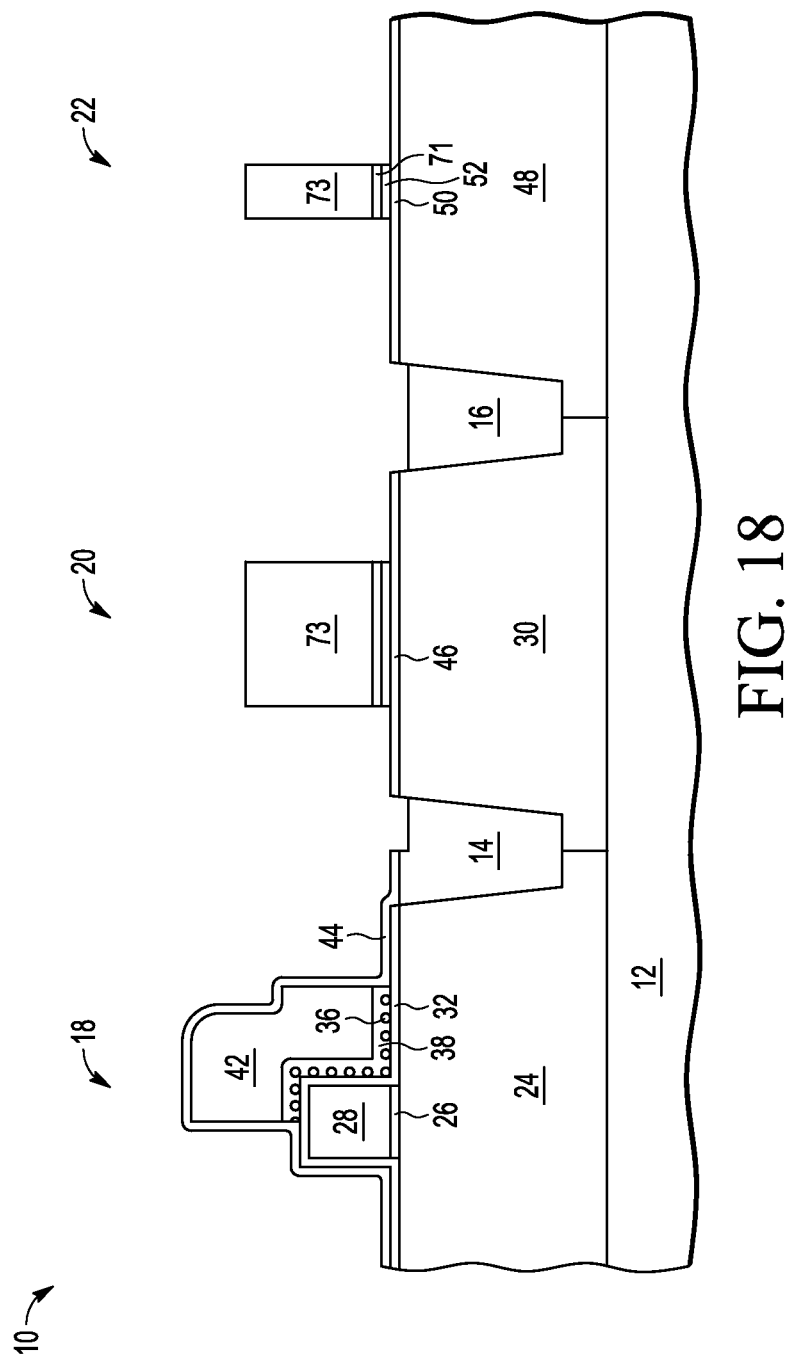
FIG. 18 is a cross section of the semiconductor structure of FIG. 17 at a subsequent stage in processing.

Shown in FIG. 18 is semiconductor structure 10 after patterning dummy gate structures of one portion of layers 52, 71, and 73 in high voltage region 20 and another portion of layers 52, 71, and 73 in logic region 22. Oxide layers 46 and 50 remain unpatterned.

Figure 19:
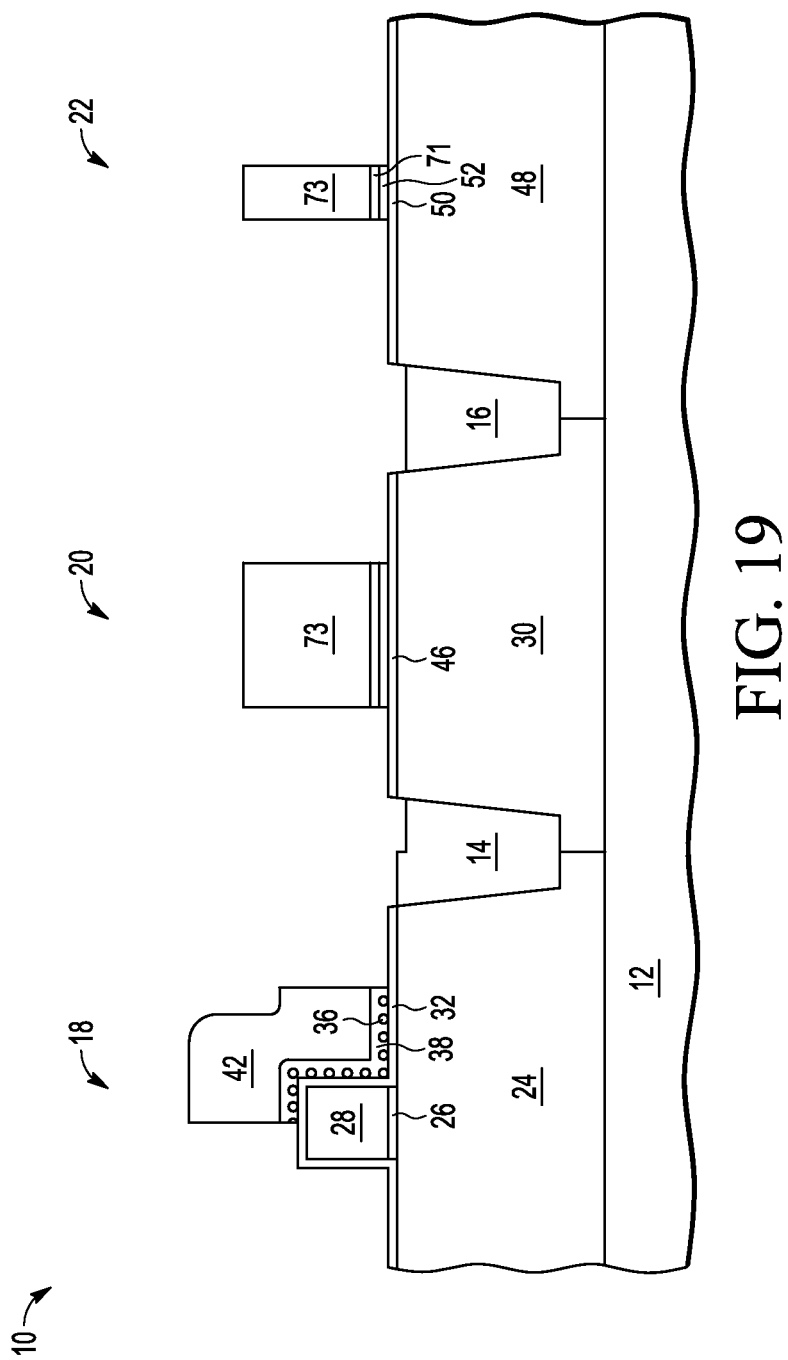
FIG. 19 is a cross section of the semiconductor structure of FIG. 18 at a subsequent stage in processing.

Shown in FIG. 19 is semiconductor structure 10 after removing protection layer 44.

Figure 20:
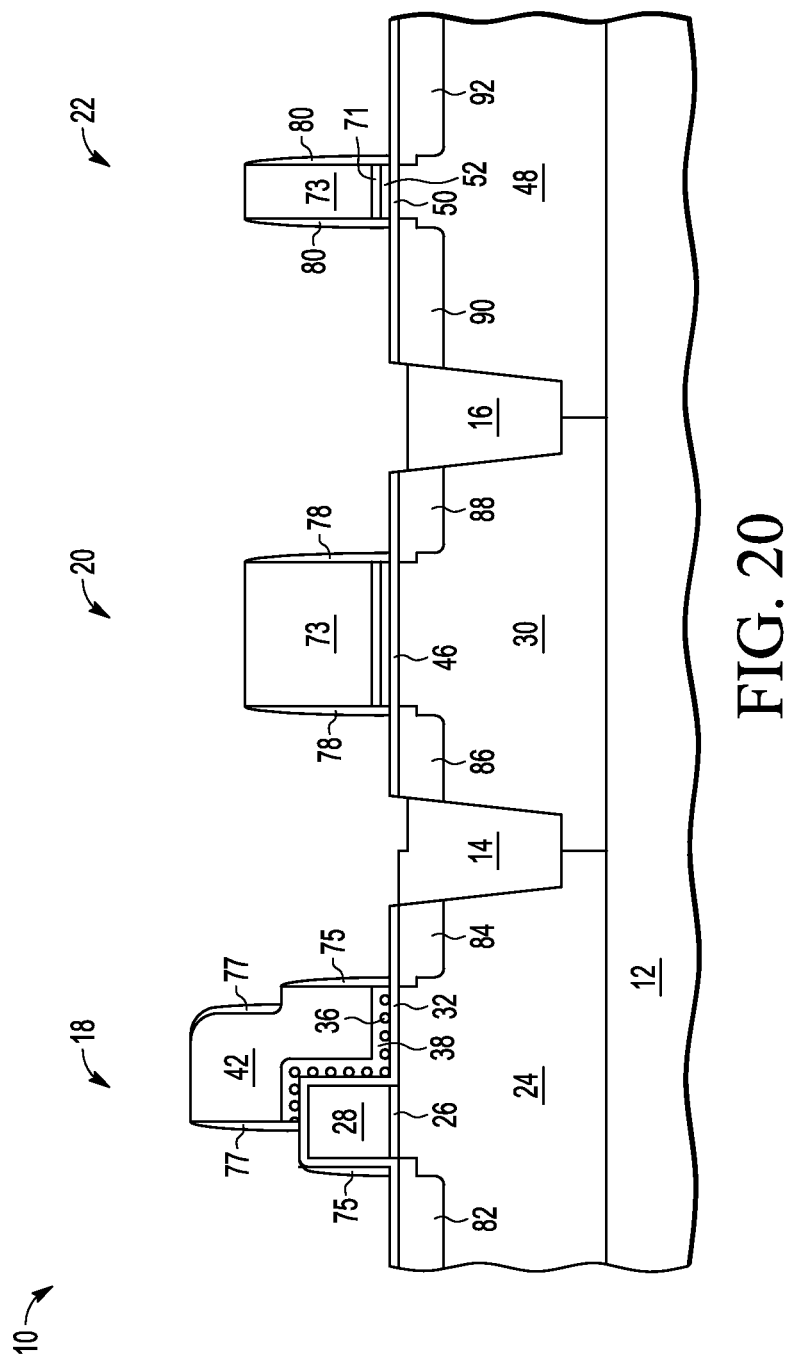
FIG. 20 is a cross section of the semiconductor structure of FIG. 19 at a subsequent stage in processing.

Shown in FIG. 20 is semiconductor structure 10 after forming sidewall spacers and source/drain regions. Sidewall spacers 75 and 77 are formed around select gate 28 and control gate 42. Source/drain regions 82 and 84 are formed in substrate 12 in NVM region 18. Sidewall spacer 78 is formed around dummy gate 73 in high voltage region 20. Source/drain regions 86 and 88 are formed in substrate 12 in high voltage region 20. Sidewall spacer 80 is formed around dummy gate 73 in logic region 22. Source/drain regions 90 and 92 are formed in substrate 12 in logic region 22.

Figure 21:
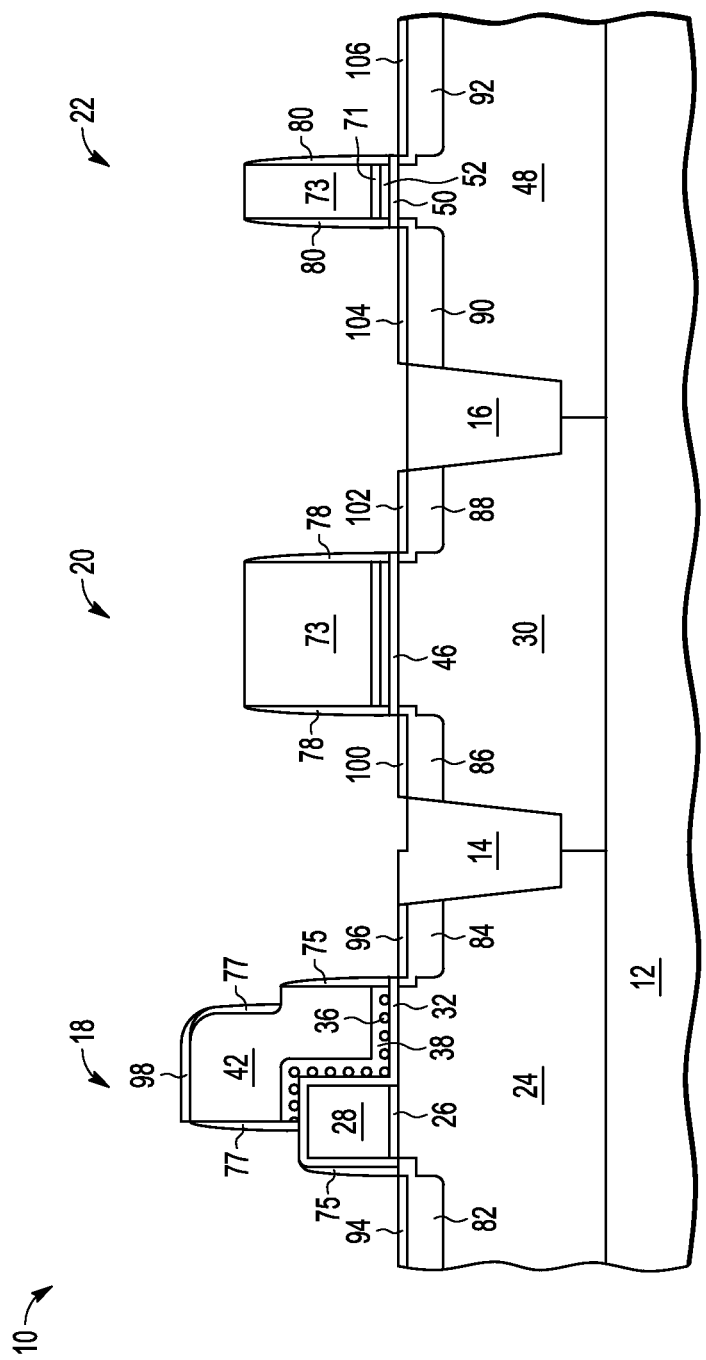
FIG. 21 is a cross section of the semiconductor structure of FIG. 20 at a subsequent stage in processing.

Shown in FIG. 21 is semiconductor structure 10 after forming silicide region 94 on source/drain region 82, silicide region 96 on source/drain region 84, silicide region 98 on control gate 42, silicide region 108 on select gate 28, silicide region 100 on source/drain region 86, silicide region 102 on source/drain region 88, a silicide region 104 on source/drain region 90, and silicide region 106 on source/drain region 92.

Figure 22:
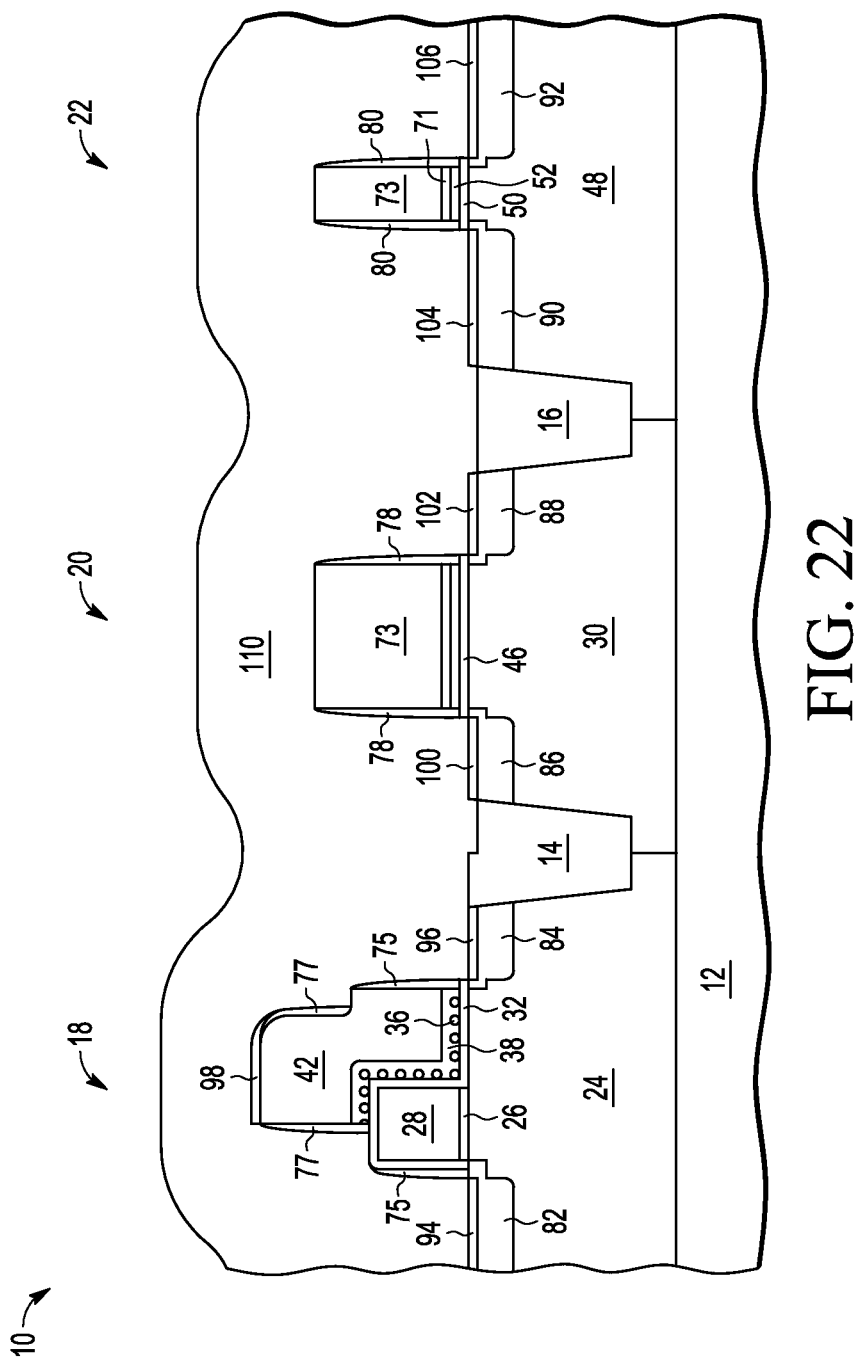
FIG. 22 is a cross section of the semiconductor structure of FIG. 21 at a subsequent stage in processing.

Shown in FIG. 22 is semiconductor structure 10 after forming a dielectric layer 110 in regions 18, 20, and 22. The lowest point of the top surface of dielectric layer 110 should be above the top surfaces of dummy gates 73.

Figure 23:
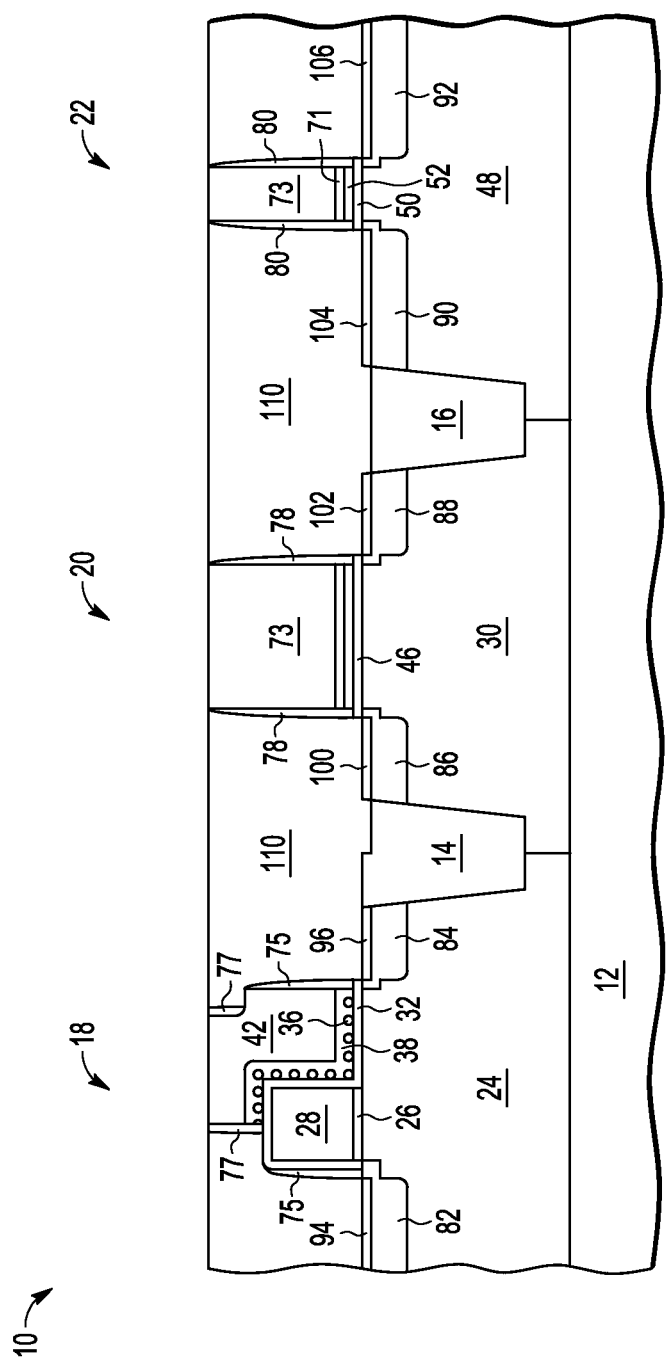
FIG. 23 is a cross section of the semiconductor structure of FIG. 22 at a subsequent stage in processing.

Shown in FIG. 23 is semiconductor structure 10 after planarizing dielectric layer 110 to the top surface of dummy gates 73.

Figure 24:
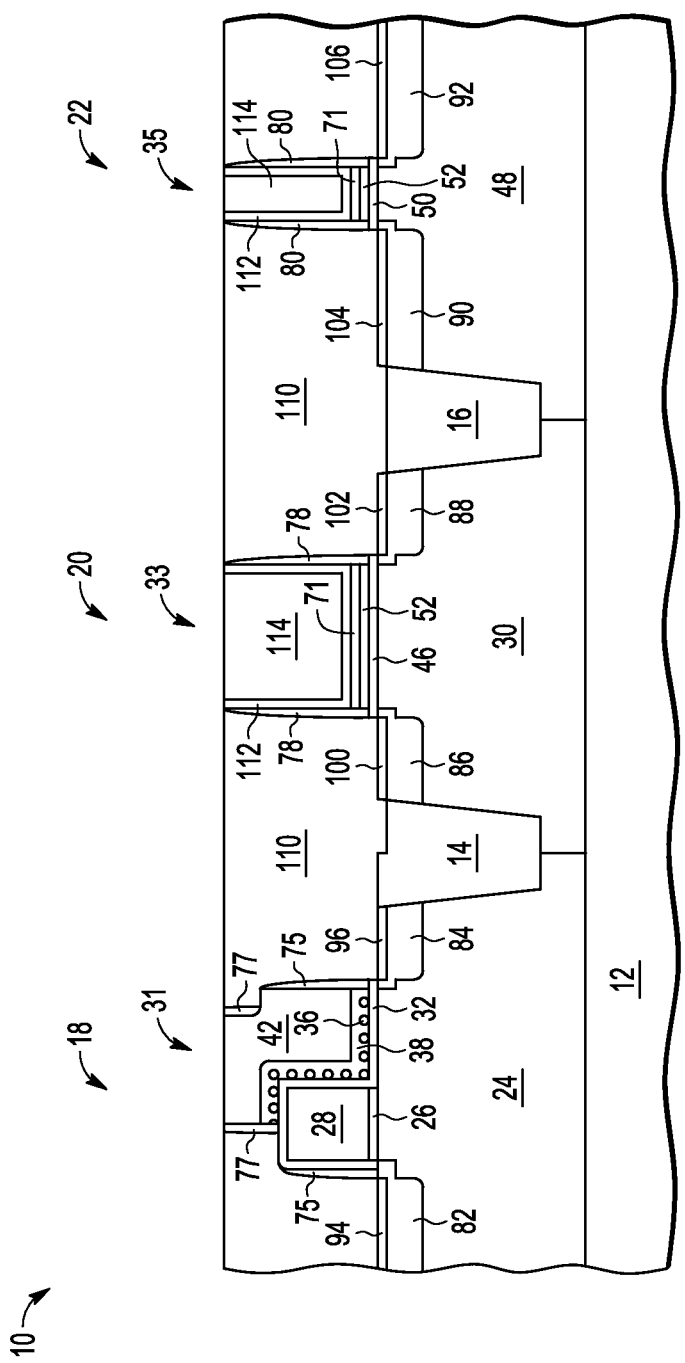
FIG. 24 is a cross section of the semiconductor structure of FIG. 23 at a subsequent stage in processing.

Shown in FIG. 24 is semiconductor structure 10 after replacing dummy gates 73 with a gate material including a liner 112 of work function setting material and a metal gate stack 114 in high voltage region 20 and logic region 22. This results in an NVM cell 31 in NVM region 18, a high voltage transistor 33 in high voltage region 20, and a logic transistor 35 in logic region 22.

Thus it is shown that in both a gate first and a gate last approach to high k metal gate transistors, an NVM can be embedded on the same integrated circuit and the logic transistor can be made in a substantially identical fashion to a logic transistor that is made in an integrated circuit that is logic only.

By now it should be appreciated that there has been provided a method of making a semiconductor device. The method includes depositing a layer of polysilicon in a non-volatile memory (NVM) region and a logic region of a substrate. The method further includes patterning the layer of polysilicon into a gate in the NVM region while the layer of polysilicon remains in the logic region. The method further includes forming a memory cell including the gate in the NVM region while the layer of polysilicon remains in the logic region. The method further includes removing the layer of polysilicon in the logic region. The method further includes implanting the substrate to form a well region in the logic region after the forming the memory cell. The method further includes depositing a layer of gate material in the logic region. The method further includes patterning the layer of gate material into a logic gate in the logic region. The method may have a further characterization by which. The method may have a further characterization by which the gate in the NVM region is a select gate and the forming the memory cell includes forming a charge storage layer over the select gate and over the logic region, depositing a second polysilicon layer over the charge storage layer, patterning the second polysilicon layer to form a control gate over a portion of a top and sidewall of the select gate, and removing the charge storage layer from areas of the NVM region that do not underlie the control gate and from the logic region. The method may have a further characterization by which the charge storage layer includes at least one of a group consisting of: nanocrystals between layers of dielectric material, a layer that includes silicon nitride, a continuous conductive layer between layers of dielectric material, and a layer of polysilicon between layers of dielectric material. The method may further include forming a logic transistor including the logic gate. The method may have a further characterization by which the substrate further includes a high-voltage region and the method further includes implanting the substrate to form a well region in a high voltage region after the patterning the layer of polysilicon into the gate in the NVM region, depositing the layer of gate material in the high-voltage region, patterning the layer of gate material into a gate in the high-voltage region, and forming a high voltage transistor including the gate in the high voltage region. The method may further include forming an oxide layer in the high voltage region while the layer of polysilicon remains in the logic region. The method may have a further characterization by which the oxide layer in the high voltage region is a grown thermal oxide. The method may further include forming first spacers on the memory cell and the logic gate and, after forming the first spacers, creating doped implant regions in the substrate for the memory cell and the logic transistor. The method may further include, after creating the doped implant regions, forming self-aligned silicide regions on exposed portions of the doped implant regions. The method may further include depositing a protection layer in the logic region and the NVM region, removing the protection layer from the logic region, and depositing a high-k dielectric layer over the logic region and the NVM region after the removing the protection layer from the logic region. The method may have a further characterization by which the logic gate is a sacrificial gate and the method further includes removing the sacrificial gate in the logic region after the forming the first spacers and forming a metal gate between the first spacers in the logic region. The method may further include creating doped implant regions in the control gate, the select gate, and the logic gate.

Also disclosed is a method of making a semiconductor device including depositing a polysilicon layer over a non-volatile memory (NVM) region and a logic region of a substrate. The method further includes forming a split gate memory cell in the NVM region of a substrate using a first portion of the polysilicon layer as a select gate in the split gate memory cell while a second portion of the polysilicon layer remains in the logic region. The method further includes, after the forming the split gate memory cell, removing the second portion of the polysilicon layer, creating a doped well in the logic region after the second portion of the polysilicon layer is removed, and forming a logic transistor in the logic region after creating the doped well in the logic region. The method may further include depositing the polysilicon layer over a high voltage region of the substrate, removing a third portion of the polysilicon layer in the high voltage region while forming the split gate memory cell in the NVM region, implanting the substrate to form a well region in the high voltage region after forming the select gate in the NVM region, forming a protection layer over the split gate memory cell in the NVM region, forming an oxide layer in the high voltage region while the polysilicon layer remains in the logic region and the protection layer remains over the split gate memory cell, depositing a layer of gate material in the high-voltage region and the logic region, patterning the layer of gate material into a gate in the high voltage region, and forming a high voltage transistor including the gate in the high voltage region. The method may have a further characterization by which the logic transistor is a high-k metal gate transistor. The method may further include depositing a protection layer over the split gate memory cell before creating the doped well in the logic region. The method may have a further characterization by which the forming the split gate memory cell includes forming the select gate, forming a charge storage layer over the select gate, and forming a control gate over the charge storage layer. The method may have a further characterization by which the forming the logic transistor includes removing a sacrificial gate in the logic region after forming first spacers on the sacrificial gate and forming a metal gate between the first spacers in the logic region.

Disclosed also is a method of making a semiconductor device including forming a non-volatile memory (NVM) cell in a memory region of a substrate in which forming the NVM cell includes depositing polysilicon over the memory region and a logic region of the substrate and forming a gate for the NVM cell using a first portion of the polysilicon while a second portion of the polysilicon remains in the logic region. The method further includes forming a protection layer on the NVM cell. The method further includes removing the second portion of the polysilicon after the forming the protection layer. The method further includes doping the substrate to form a well in the logic region after the removing the second portion of the polysilicon. The method further includes forming a logic gate stack in the logic region, the logic gate stack including a high-k dielectric material. The method further includes forming a logic transistor including the logic gate stack. The method may further include implanting the substrate to form a well region in a high voltage region of the substrate after the forming the gate for the NVM cell, forming a high-voltage gate stack in the high-voltage region, the high voltage gate stack including the high-k dielectric material, and forming a high voltage transistor including the high voltage gate stack.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different or additional types of active regions may be used such as further levels of high voltage and different well types and corresponding transistor types. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:
1. A method of making a semiconductor device comprising:
  depositing a layer of polysilicon in a non-volatile memory (NVM) region and a logic region of a substrate;
  patterning the layer of polysilicon into a gate in the NVM region while the layer of polysilicon remains in the logic region;
  forming a memory cell including the gate in the NVM region while the layer of polysilicon remains in the logic region;
  removing the layer of polysilicon in the logic region;

implanting the substrate to form a well region in the logic region after the forming the memory cell;
depositing a layer of gate material in the logic region; and
patterning the layer of gate material into a logic gate in the logic region.

2. The method of claim 1, wherein the gate in the NVM region is a select gate, the forming the memory cell comprising:
forming a charge storage layer over the select gate and over the logic region;
depositing a second polysilicon layer over the charge storage layer;
patterning the second polysilicon layer to form a control gate over a portion of a top and sidewall of the select gate; and
removing the charge storage layer from areas of the NVM region that do not underlie the control gate and from the logic region.

3. The method of claim 2 wherein the charge storage layer includes at least one of a group consisting of: nanocrystals between layers of dielectric material, a layer that includes silicon nitride, a continuous conductive layer between layers of dielectric material, and a layer of polysilicon between layers of dielectric material.

4. The method of claim 1 further comprising forming a logic transistor including the logic gate.

5. The method of claim 1 wherein the substrate further includes a high-voltage region, the method further comprising:
implanting the substrate to form a well region in a high voltage region after the patterning the layer of polysilicon into the gate in the NVM region;
depositing the layer of gate material in the high-voltage region;
patterning the layer of gate material into a gate in the high-voltage region; and
forming a high voltage transistor including the gate in the high voltage region.

6. The method of claim 5 further comprising:
forming an oxide layer in the high voltage region while the layer of polysilicon remains in the logic region.

7. The method of claim 6 wherein the oxide layer in the high voltage region is a grown thermal oxide.

8. The method of claim 4 further comprising:
forming first spacers on the memory cell and the logic gate; and
after forming the first spacers, creating doped implant regions in the substrate for the memory cell and the logic transistor.

9. The method of claim 8 further comprising:
after creating the doped implant regions, forming self-aligned silicide regions on exposed portions of the doped implant regions.

10. The method of claim 1 further comprising:
depositing a protection layer in the logic region and the NVM region;
removing the protection layer from the logic region; and
depositing a high-k dielectric layer over the logic region and the NVM region after the removing the protection layer from the logic region.

11. The method of claim 8, wherein the logic gate is a sacrificial gate, the method further comprising:
removing the sacrificial gate in the logic region after the forming the first spacers; and
forming a metal gate between the first spacers in the logic region.

12. The method of claim 2 further comprising:
creating doped implant regions in the control gate, the select gate, and the logic gate.

13. A method of making a semiconductor device comprising:
depositing a polysilicon layer over a non-volatile memory (NVM) region and a logic region of a substrate;
forming a split gate memory cell in the NVM region of a substrate using a first portion of the polysilicon layer as a select gate in the split gate memory cell while a second portion of the polysilicon layer remains in the logic region;
after the forming the split gate memory cell, removing the second portion of the polysilicon layer;
creating a doped well in the logic region after the second portion of the polysilicon layer is removed; and
forming a logic transistor in the logic region after creating the doped well in the logic region.

14. The method of claim 13 further comprising:
depositing the polysilicon layer over a high voltage region of the substrate;
removing a third portion of the polysilicon layer in the high voltage region while forming the split gate memory cell in the NVM region;
implanting the substrate to form a well region in the high voltage region after forming the select gate in the NVM region;
forming a protection layer over the split gate memory cell in the NVM region;
forming an oxide layer in the high voltage region while the polysilicon layer remains in the logic region and the protection layer remains over the split gate memory cell;
depositing a layer of gate material in the high-voltage region and the logic region;
patterning the layer of gate material into a gate in the high voltage region; and
forming a high voltage transistor including the gate in the high voltage region.

15. The method of claim 13 wherein the logic transistor is a high-k metal gate transistor.

16. The method of claim 13 further comprising:
depositing a protection layer over the split gate memory cell before creating the doped well in the logic region.

17. The method of claim 13 wherein the forming the split gate memory cell comprises:
forming the select gate;
forming a charge storage layer over the select gate; and
forming a control gate over the charge storage layer.

18. The method of claim 13 wherein the forming the logic transistor comprises:
removing a sacrificial gate in the logic region after forming first spacers on the sacrificial gate; and
forming a metal gate between the first spacers in the logic region.

19. A method of making a semiconductor device comprising:
forming a non-volatile memory (NVM) cell in a memory region of a substrate,
wherein forming the NVM cell includes:
depositing polysilicon over the memory region and a logic region of the substrate; and
forming a gate for the NVM cell using a first portion of the polysilicon while a second portion of the polysilicon remains in the logic region;
forming a protection layer on the NVM cell;
removing the second portion of the polysilicon after the forming the protection layer;

doping the substrate to form a well in the logic region after the removing the second portion of the polysilicon;

forming a logic gate stack in the logic region, the logic gate stack including a high-k dielectric material; and forming a logic transistor including the logic gate stack.

20. The method of claim 19 further comprising:

implanting the substrate to form a well region in a high voltage region of the substrate after the forming the gate for the NVM cell;

forming a high-voltage gate stack in the high-voltage region, the high voltage gate stack including the high-k dielectric material; and forming a high voltage transistor including the high voltage gate stack.

* * * * *